United States Patent [19]

Sugiura et al.

[11] Patent Number: 4,872,041
[45] Date of Patent: Oct. 3, 1989

[54] SEMICONDUCTOR DEVICE EQUIPPED WITH A FIELD EFFECT TRANSISTOR HAVING A FLOATING GATE

[75] Inventors: June Sugiura, Musashino; Kazuhiro Komori, Kodaira, both of Japan

[73] Assignee: Hitachi, Ltd., Tokyo, Japan

[21] Appl. No.: 161,433

[22] Filed: Feb. 24, 1988

Related U.S. Application Data

[63] Continuation of Ser. No. 701,245, Feb. 13, 1985, abandoned.

[30] Foreign Application Priority Data

Feb. 24, 1984 [JP] Japan .................. 59-32355

[51] Int. Cl.$^4$ ............... H01L 29/78; H01L 29/04
[52] U.S. Cl. .................... 357/23.5; 357/23.9; 357/23.11; 357/59
[58] Field of Search ............... 357/23.5, 23.9, 23.11, 357/41, 59 G, 59 I, 59 J

[56] References Cited

U.S. PATENT DOCUMENTS

| | | |
|---|---|---|
| 3,825,946 | 7/1974 | Frohman-Bentchkowsky ................ 357/23.5 |
| 3,984,822 | 10/1976 | Simko et al. ............. 357/23.5 |
| 4,203,158 | 5/1980 | Frohman-Bentchkowsky ................ 357/23.5 |
| 4,267,011 | 5/1981 | Shibata et al. ............ 357/59 G |
| 4,295,897 | 10/1981 | Tubbs et al. ............. 357/59 G |
| 4,397,077 | 8/1983 | Derbenwick et al. ........ 357/49 |
| 4,431,900 | 2/1984 | Delfino et al. ........... 219/121 LM |
| 4,442,591 | 4/1984 | Haken .................... 357/42 |
| 4,451,904 | 5/1984 | Sugiura et al. ........... 357/23.5 |
| 4,471,373 | 9/1984 | Shimizu et al. ........... 357/23.5 |
| 4,536,944 | 8/1985 | Bracco et al. ............ 357/23.5 |

FOREIGN PATENT DOCUMENTS

| | | |
|---|---|---|
| 25311 | 3/1981 | European Pat. Off. ......... 357/23.5 |
| 5544742 | 3/1980 | Japan ..................... 357/23.5 |
| WO832199 | 6/1983 | PCT Int'l Appl. . |

OTHER PUBLICATIONS

Tsang et al., "Fabrication of High-Performance LDDFET's with Oxide Sidewall-Spacer Technology" IEEE Trans. Electron Devices vol. ED-29, pp. 590–595.

*Primary Examiner*—Gene M. Munson
*Attorney, Agent, or Firm*—Antonelli, Terry & Wands

[57] ABSTRACT

Disclosed is a semiconductor device, and method of manufacture thereof, the device having a conductive layer formed on a semiconductor substrate, with an insulating layer interposed between the substrate and conductive layer, and wherein a dense insulating layer is disposed at the sides of the conductive layer so as to cover the sides of the insulating layer on the substrate, the dense insulating layer acting to increase retention of charge in the conductive layer. The conductive layer can be the floating gate of a field effect transistor, with a control gate formed on the floating gate via another insulating layer whose sides can also be covered by the dense insulating layer. Such field effect transistor, having the floating gate, can be used as the memory cell of an EPROM, with the charge being the data stored in the cell. A field effect transistor of a peripheral circuit of the EPROM can also have the dense insulating layer applied so as to cover the sides of the gate oxide layer thereof.

22 Claims, 20 Drawing Sheets

SEMICONDUCTOR DEVICE EQUIPPED WITH A FIELD EFFECT TRANSISTOR HAVING A FLOATING GATE

This application is a continuation application of application Ser. No. 701,245, filed Feb. 13, 1985, and now abandoned.

BACKGROUND OF THE INVENTION

This invention relates to a technique which is effective when applied to a semiconductor integrated circuit device. More particularly, the present invention relates to a technique which is effective when applied to a semiconductor integrated circuit device equipped with a field effect transistor having a floating gate.

A semiconductor integrated circuit device equipped with a read-only memory function capable of rewriting data by ultraviolet rays (hereinafter called "EPROM") is known. A memory cell for storing data in an EPROM consists of a field effect transistor equipped with a floating gate disposed on a semiconductor substrate via a first insulating layer and a control gate disposed on the floating gate via a second insulating layer. Generally, both floating and control gates consist of polycrystalline silicon (Refer, for example, to the magazine "Nikkei Electronics", Jan. 5, 1981, pp. 181–201.)

It is possible in principle to cover sides of both the floating and control gate with a compact silicon oxide layer formed by thermal oxidation techniques in order to improve the retention characteristics of the charge, as the data, stored in the floating gate. This is necessary to limit the reduction of the stored charge due to leakage that develops between the edge portion of the floating gate and the source-drain region or the control gate.

As a result of experiments and studies on such technique, the inventors of the present invention have found out the fact that the retention characteristics of charge, as the data, stored in the floating gate can be improved by covering both floating and control gates with a compact silicon oxide layer, formed by thermal oxidation, having a film thickness equal to, or greater than, the film thickness of the first insulating layer.

The inventors believe, however, that such a compact silicon oxide layer having a film thickness equal to, or greater than, the film thickness of the first insulating layer is contradictory to the miniaturization of the memory device for the following reasons.

With the miniaturization of the EPROM, memory cell reliability and operating speed drop in the data write and read modes. On the other hand, a heat-treatment step for an extended period of time is necessary in order to obtain a desired film thickness for the compact silicon oxide layer. The forming speed of the silicon oxide layer between the floating gate and the control gate is higher than the forming speed of the silicon oxide layer between the floating gate and the semiconductor substrate. Moreover, the forming speed of the silicon oxide layers are higher at the edge portions of the surfaces of the floating and control gates than that on the main surface of the semiconductor substrate. Accordingly, lift-up occurs, particularly at the edge of the control gate. This means that in comparison with the parasitic capacitance formed by the former, the parasitic capacitance formed by the latter is bigger. Thus, the potential of the floating gate drops with the result that the efficiency as well as reliability drop in the write mode of the data to the memory cell. In the data read mode from the memory cell, on the other hand, the quantity of current that flows through the channel region between the source and drain regions becomes smaller. This makes it difficult to rapidly discharge the charge that is charged in a data line, and invites the drop of the speed. The shorter the channel length, the more remarkable this phenomenon, because the proportion of the capacitance drop becomes greater This creates a problem for the miniaturization of the memory cell.

The source or drain region of the field effect transistor to serve as the memory cell is formed in the following way. An impurity for forming the region is introduced by ion implantation into the main surface of the semiconductor substrate on both sides of the floating and control gates using these gates as the mask. Thereafter, the compact silicon oxide layer is formed, and the impurity is subjected to drive-in diffusion. In this case, since the heat-treatment step for a long period is necessary as described above, the effective channel length between the source and drain regions becomes shorter because drive-in diffusion is effected excessively. This induces the short channel effect, invites a drop in reliability of the EPROM in the data read and write modes, and is unsuitable for the scale-down of the memory cell.

SUMMARY OF THE INVENTION

It is therefore an object of the present invention to improve the retention characteristics of the charge stored in the floating gate of the field effect transistor.

It is another object of the present invention to improve the reliability of a semiconductor integrated circuit device equipped with a field effect transistor having a floating gate.

It is still another object of the present invention to improve the operating speed of a semiconductor integrated circuit device equipped with a field effect transistor having a floating gate.

It is still another object of the present invention to improve the reliability of a field effect transistor having a floating gate that is on a semiconductor substrate via an insulating layer.

It is still another object of the present invention to improve the operating characteristics of a MISFET, having a gate electrode, or any other semiconductor device utilizing a conductive layer disposed above a semiconductor substrate and isolated therefrom by an insulating layer disposed between the conductive layer and semiconductor substrate.

These and other objects and novel features of the present invention will become more apparent from the following description of this specification when taken in conjunction with the accompanying drawings.

Generally, the objects of the present invention are achieved by providing a dense insulating layer at the sides of the gate of, e.g., a MISFET, covering, e.g., at least the sides of a gate insulating layer interposed between the gate and semiconductor substrate. Such dense insulating layer can prevent charge leakage from the gate electrode to source/drain regions of the MISFET.

Among the inventions disclosed in this application, the following is a brief explanation of a typical example.

A dense insulating layer, covering the sides of at least a gate insulating layer and an inter-layer insulating layer, is disposed sideways of a conductive layer of a field effect transistor consisting of, e.g., a floating gate, which is disposed on a semiconductor substrate via a gate insulating layer, and a control gate disposed on the floating gate via the inter-layer insulating layer. This arrangement makes it possible to check undesirable leakage that would otherwise occur between the edge of the floating gate and the source or drain region. Furthermore, this arrangement does not require a compact silicon oxide layer formed by the thermal oxidation technique, and can restrict the drop of the parasitic capacitance constituted by the floating gate and the control gate. Accordingly, the retention characteristics of the charge, as the data stored in the floating gate, can be improved. Furthermore, the reliability and operating speed in the write and read modes of the data can also be improved.

DETAILED DESCRIPTION OF THE INVENTION

Figure 1:
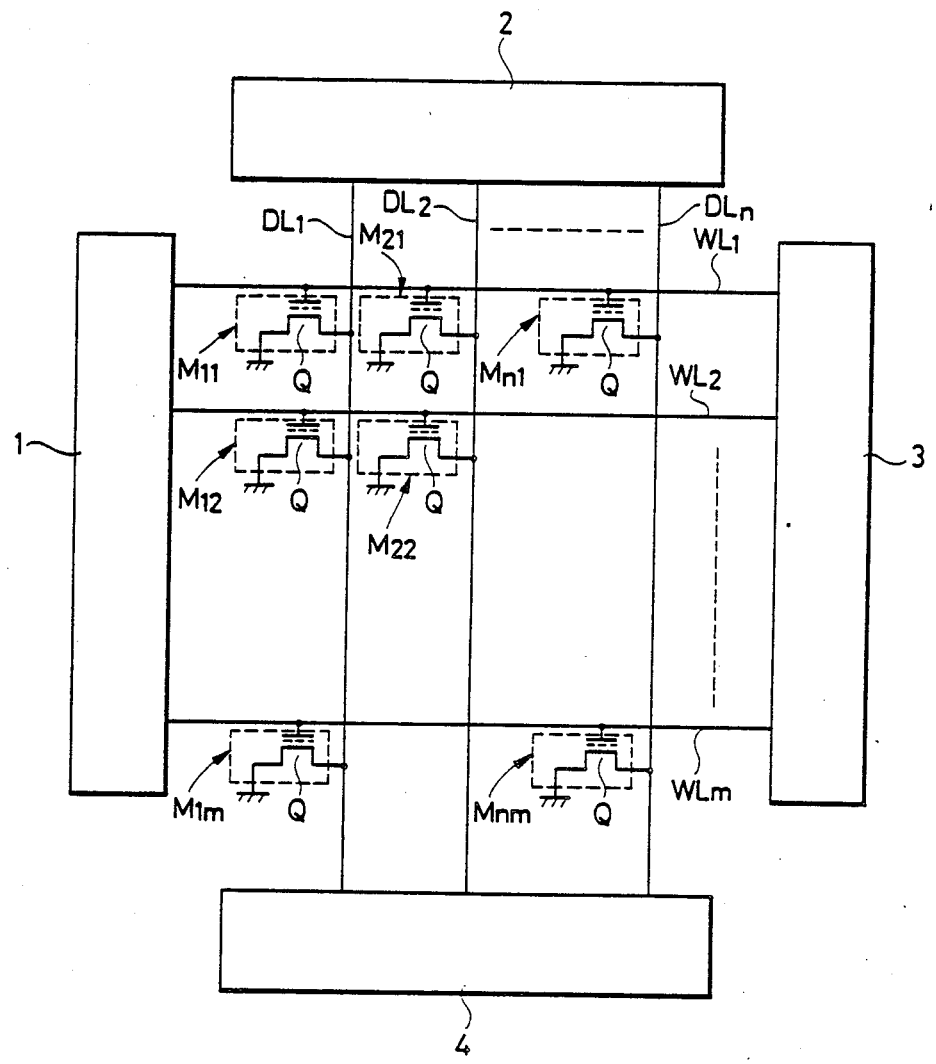
FIG. 1 is an equivalent circuit diagram showing principal portions of an EPROM and is useful for explaining the outline of Embodiment I of the present invention.

Hereinafter, the present invention will be described with reference to embodiments thereof.

Incidentally, like reference numerals are used throughout all the drawings to identify like constituent elements, and their repeated explanation will be omitted.

The embodiments of the invention will be described with reference to an EPROM using a field effect transistor having a floating gate and a control gate as a memory cell. However, the invention is not limited thereto, and can be applied to any floating gate field effect device; or to any MISFET, or other field effect device, having gate electrodes; or, generally, to semiconductor devices having conductive layers disposed above a semiconductor substrate and isolated therefrom by an insulating layer disposed between the conductive layer and the substrate.

Embodiment I

FIG. 1 is an equivalent circuit diagram showing the principal portions of an EPROM and is useful for explaining the outline of Embodiment I of the present invention.

In the diagram, an X decoder 1 selects a predetermined word line to be later described, and turns "ON" a memory cell connected to the selected word line. A Y decoder 2 selects a predetermined data line to be later described, and applies a voltage as data to the selected data line. A write circuit 3 selects a predetermined word line to be later described, and writes the data in a predetermined memory cell connected to the selected word line. A sense amplifier 4 selects a predetermined data line to be later described, and reads the data from a predetermined memory cell connected to the selected data line.

Each of the symbols $WL_1$, $WL_2$, ... , $WL_m$ represents a word line whose one end is connected to the X decoder 1 and whose other end is connected to the write circuit 3. A plurality of these word lines, disposed in the Y direction so as to extend in the X direction, turn "ON" the memory cells connected to them and write the data. Symbols $DL_1$, $DL_2$, ... , $DL_n$ represent data lines each of which have one end connected to the Y decoder 2 and the other end connected to the sense amplifier 4, and a plurality of data lines are disposed in the X direction so as to extend in the Y direction. They transmit the data of the memory cells $M_{11}$, $M_{12}$, ... , $M_{nm}$, disposed at the points of intersection between the words lines WL and the data lines DL. Each memory cell M has a floating gate and a control gate connected to the predetermined word line WL. Each memory cell consists of a field effect transistor Q. One of the ends of the transistor Q is connected to the predetermined data line DL with the other end being grounded. A plurality of memory cells disposed in a matrix form a memory cell array.

Next, the definite construction of this embodiment will be described.

Figure 2:
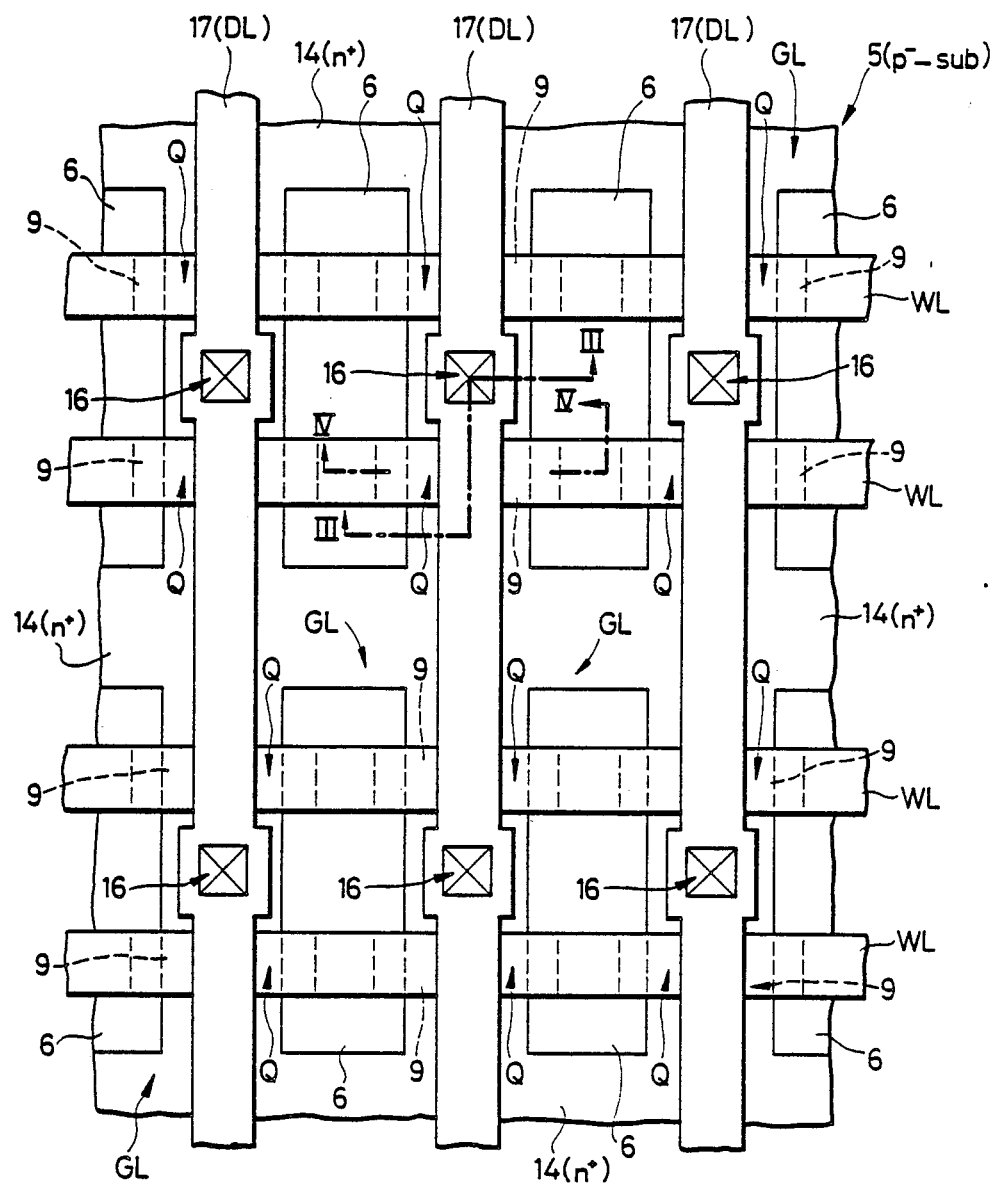
FIG. 2 is a plan view showing principal portions of an EPROM and is useful for explaining Embodiment I of the present invention.
Figure 3:
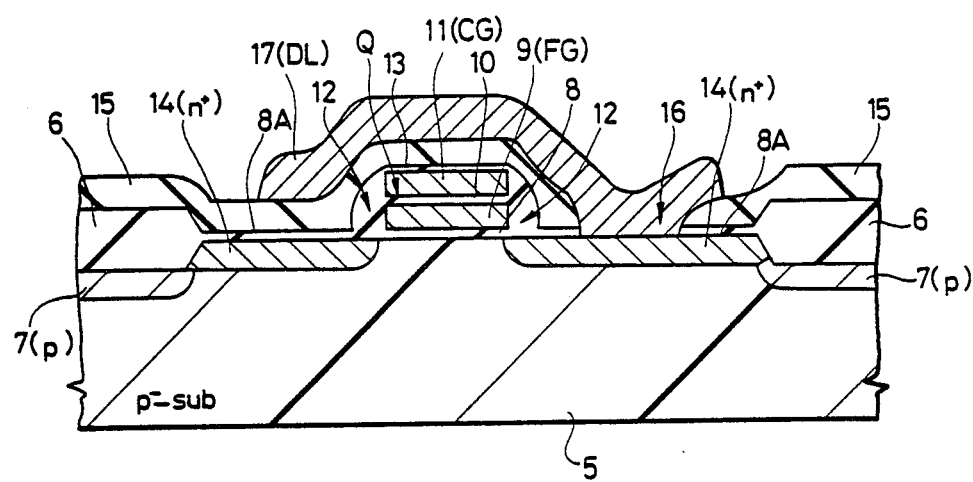
FIG. 3 is a sectional view taken along line III—III of FIG. 2.
Figure 4:
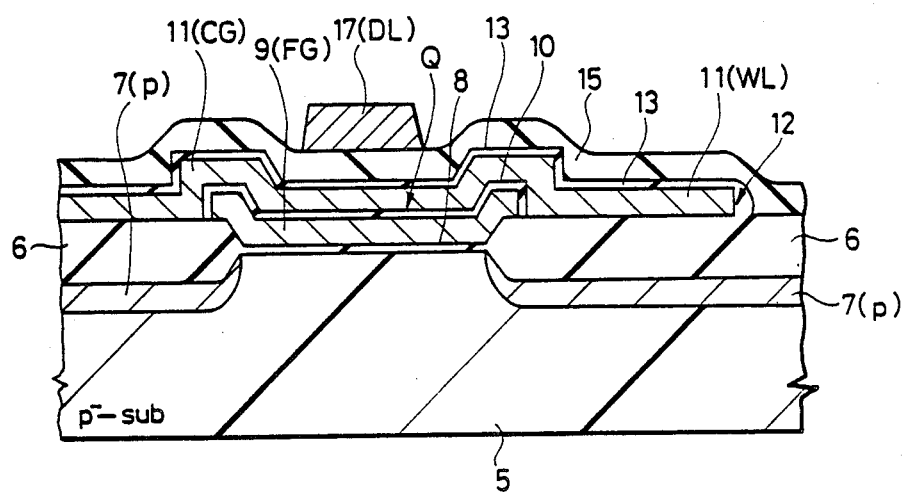
FIG. 4 is a sectional view taken along line IV—IV of FIG. 2.

FIG. 2 is a plan view of the principal portions of an EPROM and is useful for explaining Embodiment 1 of this invention. FIG. 3 is a sectional view taken along line III—III of FIG. 2, and FIG. 4 is a sectional view taken along line IV—IV of FIG. 2. Incidentally, interlayer insulating layers to be disposed between conductive layers are not shown in FIG. 2 for ease of illustration.

In FIGS. 2 through 4, a field insulating layer 6 is disposed between regions where semiconductor devices are to be primarily formed, on one main surface of a p⁻-type semiconductor substrate 5 consisting of, e.g., silicon single crystal. This field insulating layer 6 is to electrically isolate the semiconductor devices from one another. A p-type channel stopper region 7 is disposed on the main surface of the semiconductor substrate 5 below the field insulating layer 6 in order to further isolate electrically the semiconductor devices from one another.

Reference numerals 8 and 8A represent insulating layers that are disposed on the main surface of the semiconductor substrate 5 in the regions where the semiconductor devices are to be formed. The insulating layer 8 primarily forms the gate insulating layer of a field effect transistor. A conductive layer 9 is disposed at a predetermined portion on the insulating layer 8 so as to constitute the floating gate (FG) of a memory cell of an EPROM. Reference numeral 10 represents an insulating layer which is disposed so as to cover the upper portion of the conductive layer 9. This layer 10 primarily isolates electrically the conductive layer 9 from another to be disposed on the conductive layer 9. Reference numeral 11 represents a plurality of conductive layers arranged in the Y direction and disposed on a plurality of conductive layers 9 that are arranged in the X direction via the insulating layer 10. The conductive layer 11 constitutes a control gate (CG) of the memory cell of the EPROM in the region where the semiconductor device is to be formed, that is, on the conductive layer 9, and forms the word line (WL) of the EPROM at the rest of the portions thereof.

Reference numeral 12 represents an insulating layer which is disposed in close contact with the sides of conductive layers 9, 11, or with the side of the conductive layer 9, and is disposed to cover at least sides of the insulating layer 8 serving as the gate insulating layer and to cover sides of insulating layer 10. The insulating layer 12 consists, for example, of a densified (compact) silicon oxide layer which is prepared by baking a silicon oxide layer which has been formed by chemical vapor deposition (hereinafter called "CVD"), the baking being performed for rendering the silicon oxide layer formed by CVD denser (compact). The insulating layer 12 is disposed in such a manner as to cover at least sides of the insulating layer 8, interposed between the conductive layer (FG) 9 and the semiconductor substrate 5. The thickness of this insulating layer 12 is equal to, or greater than, the thinner of the insulating layer 8 and the insulating layer 10. The insulating layer 12 restricts the leakage of charge that would otherwise occur between the conductive layers, or the leakage of charge that would otherwise occur at the upper surface of the insulating layer 8A, and thus improves the retention characteristics of the charge as the data to be stored in the conductive layer 9.

Since sides of the insulating layer 10 interposed between the conductive layer (FG) 9 and the conductive layer (CG) 11 are covered with the insulating layer 12, heat-treatment for an extended period of time for thermal oxidation is not necessary. Accordingly, lift-up at the edge of the conductive layer (CG) 11 does not occur, and the drop of capacitance formed by the conductive layers 9 and 11 can be prevented. This means that the efficiency in the write and read modes of the memory cell can be improved, and the reliability as well as operating speed can also be improved in the read mode. Furthermore, the insulating layer 12 is arranged so as to mitigate the acute step that would otherwise be formed by the conductive layers 9 and 11. Accordingly, depositability of the conductive layer, which is to be deposited on the insulating layer 12 and consists of Al, for example, can be improved.

Reference numeral 13 represents an insulating layer which is disposed on the conductive layer 11 so as to come into contact with the insulating layer 12. An n⁺-type semiconductor region 14 is disposed extending to the main surface of the semiconductor substrate 5 on both sides of the conductive layers 9 and 11 where the semiconductor device is to be formed. The n⁺-type semiconductor region 14 is used as the source or drain region, or as a ground line (GL), and forms part of the memory cell of the EPROM.

The memory cell M of the EPROM, that is, the field effect transistor Q, consists primarily of the semiconductor substrate 5, the conductive layer 9 disposed on the substrate 5 via the insulating layer 8, the conductive layer 11 disposed on the conductive layer 9 via the insulating layer 10, and the pair of semiconductor regions 14.

An insulating layer 15 is disposed on the field insulating layer 6 and the insulating layers 8, 8A, 12, and 13 in such a manner as to cover the semiconductor devices and to electrically isolate them from a conductive layer to be disposed on them. The insulating layers 8A, 15 on the predetermined semiconductor region 14 are selectively removed, and a contact hole 16 is disposed to establish electric connection with a conductive layer to be disposed on the insulating layer 15. A plurality of conductive layers 17 are disposed so as to electrically connect with the predetermined semiconductor regions 14 via the contact holes 16 and to extend in the Y direction while crossing the conductive layer (WL) 11 on the insulating layer 15. The conductive layers 17 constitute the data lines (DL) of the EPROMs.

Next, the dependence of the retention characteristics of charge, as the data, upon the film thickness of the insulating layer 12, which is disposed sideways of the conductive layers 9 and 11 of the memory cell, will be described.

Figure 5:
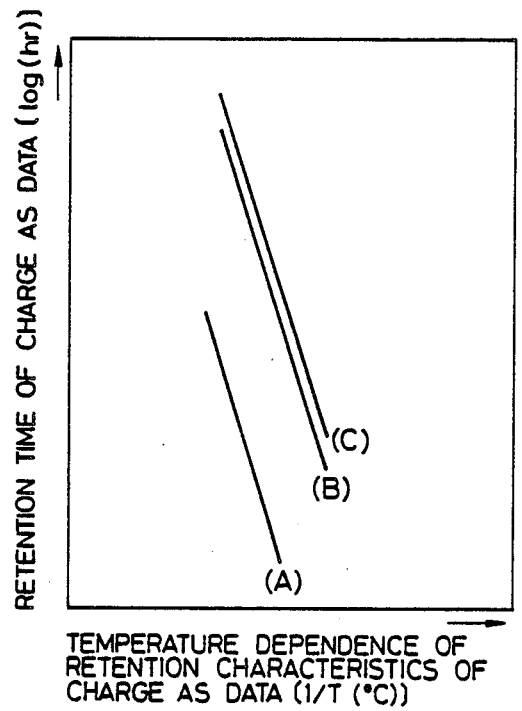
FIG. 5 is a diagram showing the dependence of the holding characteristics of charge as the data upon the film thickness of an insulating layer, and is useful for explaining Embodiment I of the present invention.
Figure 6:
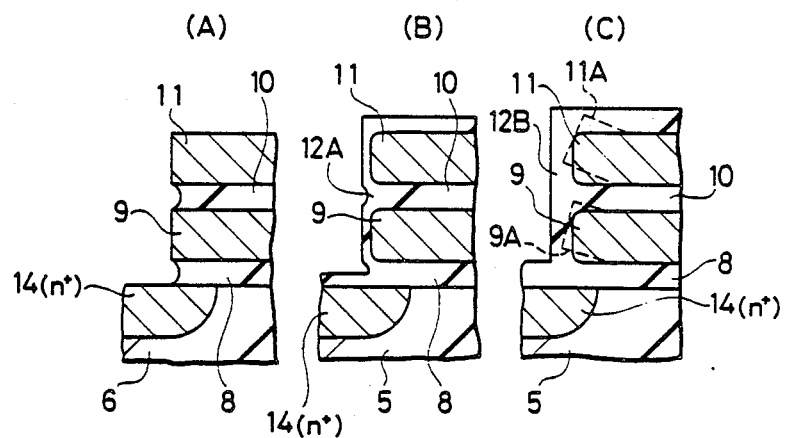
FIGS. 6(A) through 6(C) are sectional views of principal portions of an EPROM in which the film thickness of an insulating layer is changed.

FIG. 5 is a diagram showing the dependence of the retention characteristics of the charge, as the data, upon the thickness of the insulating layer 12, and FIGS. 6(A) through 6(C) are sectional views of the principal portions of the memory cell (model) of an EPROM in which the film thickness of the insulating layer 12 is variable.

Referring to FIG. 5, the abscissa represents the temperature dependence [1/T ( C)]of the holding characteristics of the charge, as the data, and the ordinate represents the logarithm [log (hr)]of the holding time of the charge as the data. The lines (A), (B) and (C) correspond to the models shown in FIGS. 6(A), 6(B) and 6(C), respectively.

In FIGS. 6(A) through 6(C), FIG. 6(A) represents the model in which no compact silicon oxide layer, to cover sides of conductive layers 9, 11 that are patterned by self-alignment, is used. FIG. 6(B) shows the model in which compact silicon oxide layer 12A, formed by thermal oxidation to cover sides of the conductive layers 9, 11 that are patterned by self-alignment, is formed in a thickness about ½ the thickness of the insulating layer 8. FIG. 6(C) shows the model in which compact silicon oxide layer 12B, formed by thermal oxidation to cover the conductive layers 9, 11 that are patterned by self-alignment, is formed in a film thickness which is equal to, or greater than, the smaller of the film thickness of the insulating layers 8 and 10. As can be appreciated from these FIGS. 6(A) through 6(C), the thickness of the layers 12A and 12B are measured parallel to the surface of the semiconductor substrate.

As can be seen clearly from FIGS. 5 and 6(A) through 6(C), the retention time of the charge, as the data, can be improved by covering sides of conductive layers 9, 11 with the silicon oxide layer 12B.

In accordance with the present invention, the silicon oxide layer 12B having a film thickness equal to, or greater than, the smaller of the film thickness of the insulating layers 8 and 10 covers edges of the conductive layers 9, 11, so that it becomes possible to restrict the charge stored in the conductive layer 9 from leaking from the edge portion of the conductive layer 9 to the semiconductor substrate 5 or to the conductive layer 11, and to improve the retention characteristics of the charge. However, when the silicon oxide layer 12B is formed by thermal oxidation, a heat-treatment step for an extended period is necessary, and this causes lift-up at the end portions of the conductive layers 9, 11 such as the conductive layers 9A, 11A as indicated by dotted lines in FIG. 6(C). This is because the growing speed of the oxide film at the end portions of the conductive layers 9 and 11 is greater than that on the main surface of the semiconductor substrate 5. Accordingly, this embodiment uses an insulating layer 12 that is prepared by baking a silicon oxide layer formed by CVD, for example, in place of the silicon oxide layer 12B formed by thermal oxidation. Such baking makes such silicon oxide layer formed by CVD denser. Preferably, its film thickness is equal to, or greater than, the smaller of the film thickness of the insulating layers 8 and 10.

Next, a production method of the present invention will be described.

Figure 7A:
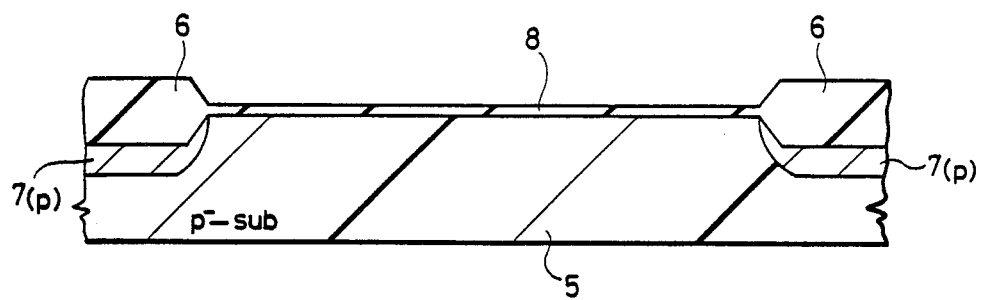
FIGS. 7(A) through 7(K) are sectional views of principal portions of an EPROM during production steps thereof, and is useful for explaining a production method of Embodiment I of the present invention.
Figure 7B:
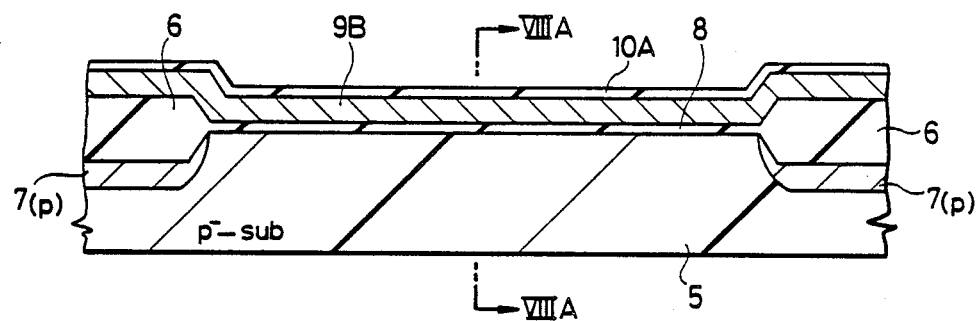
Figure 7C:
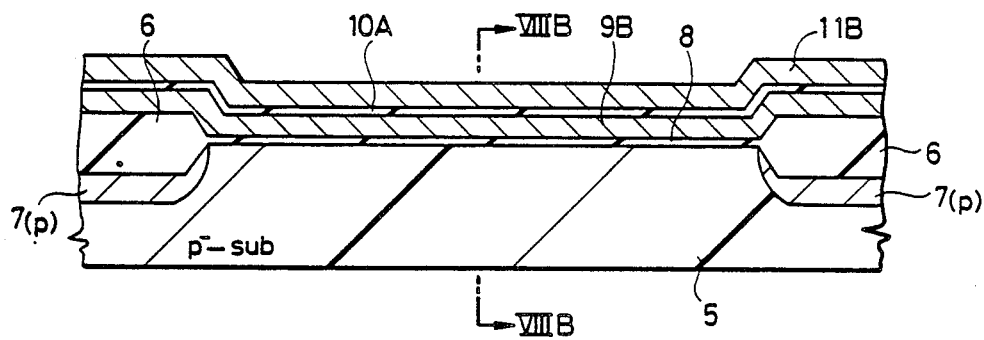
Figure 7D:
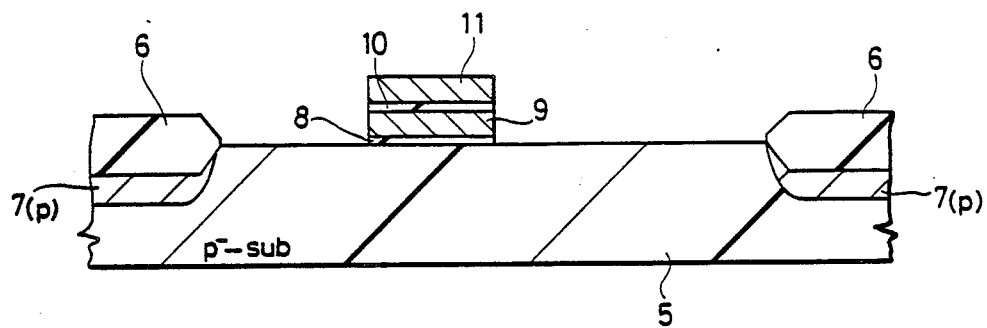
Figure 7E:
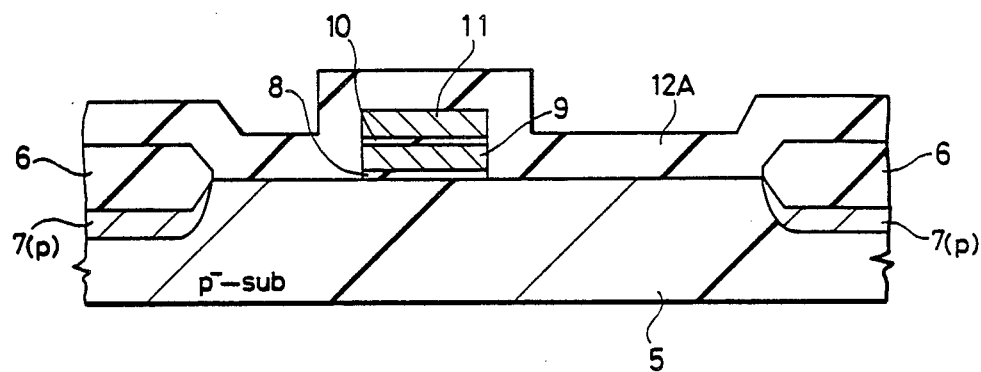
Figure 7F:
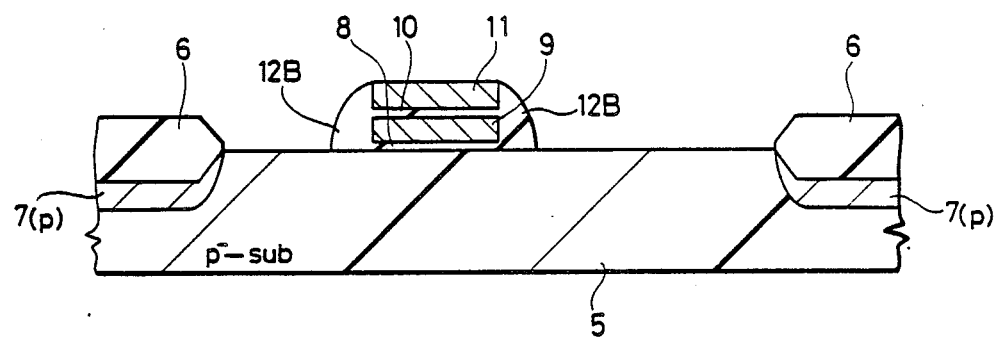
Figure 7G:
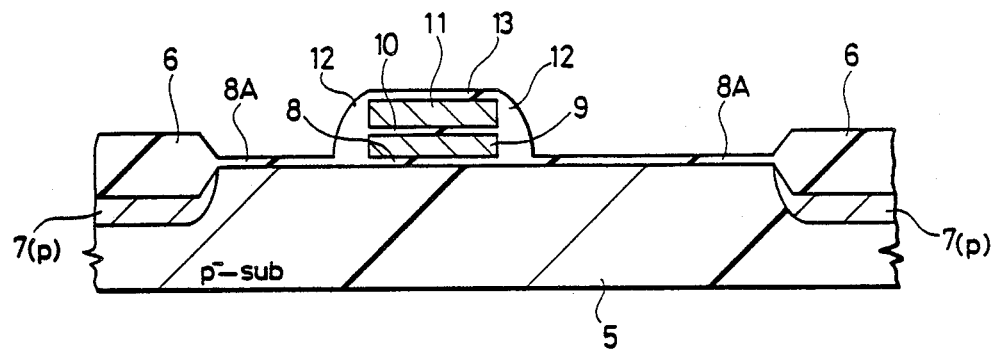
Figure 7H:
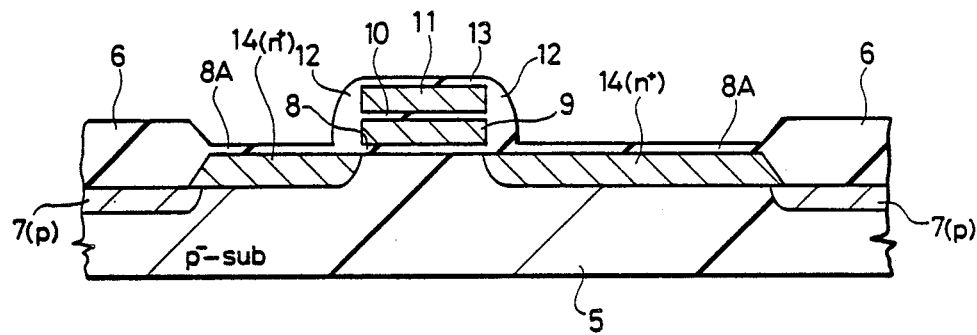
Figure 7I:
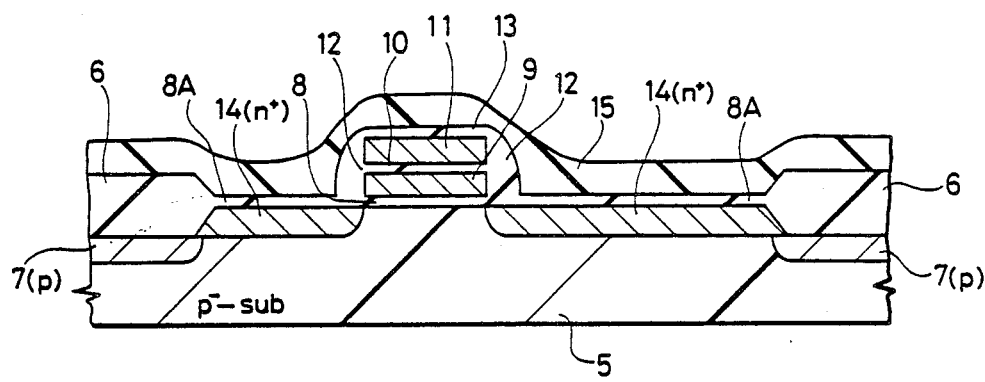
Figure 7J:
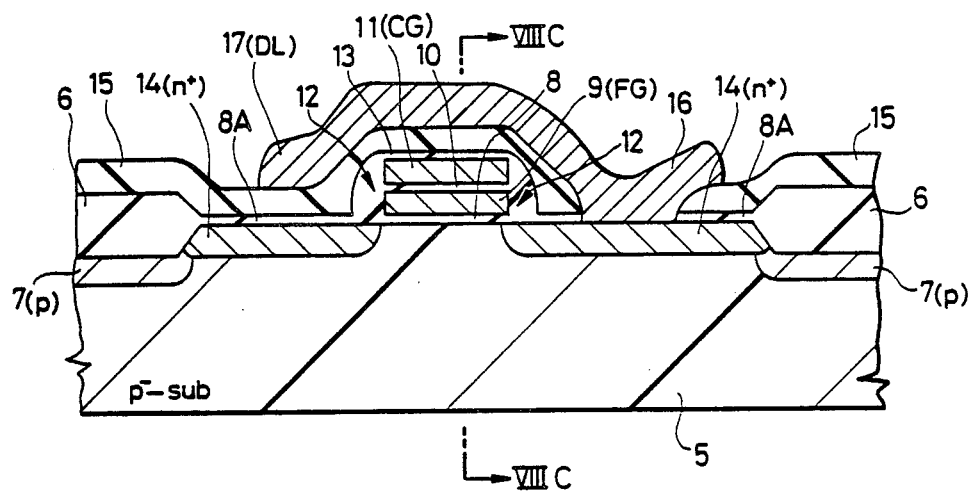
Figure 8A:
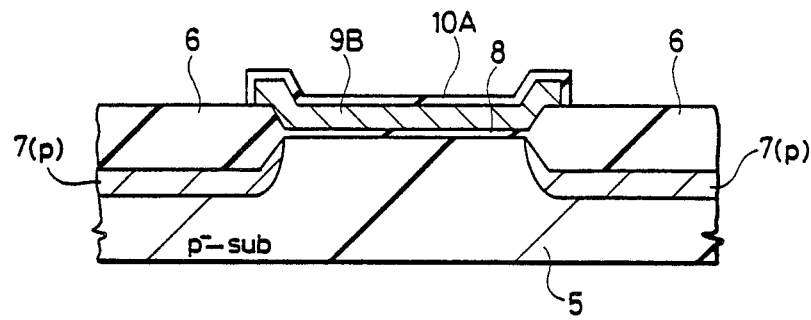
FIG. 8(A) is a sectional view taken along line VIII A —VIII A in FIG. 7(B)
Figure 8B:
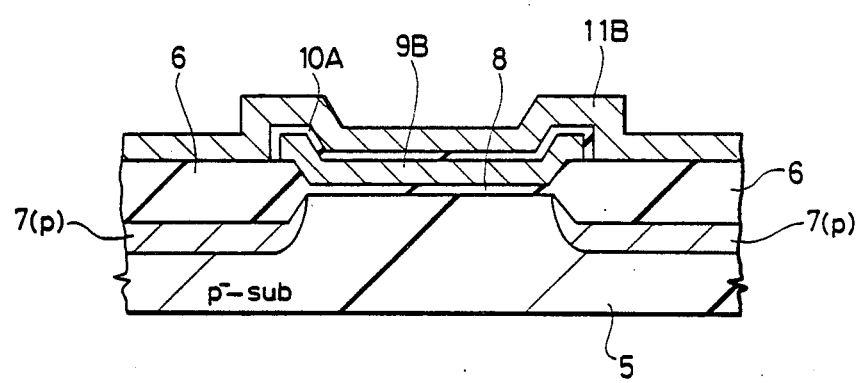
FIG. 8(B) is a sectional view taken along line VIII B—VIII B in FIG. 7(C)
Figure 8C:
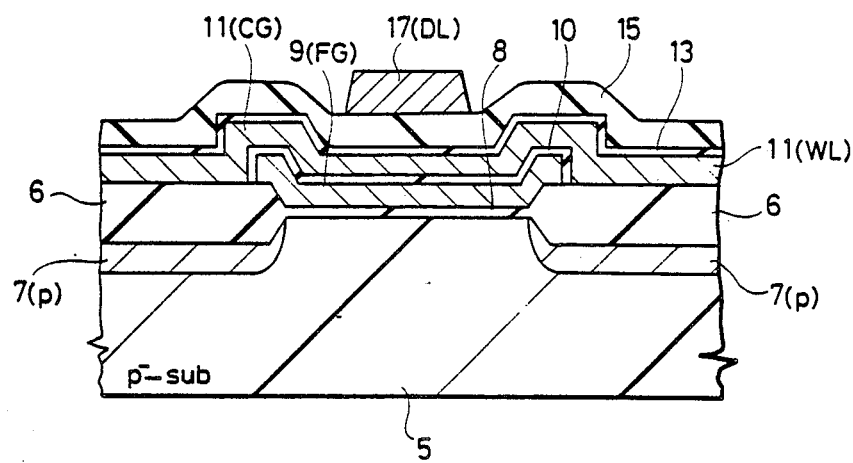
FIG. 8(C) is a sectional view taken along line VIII C—VIII C in FIG. 7(J)

FIGS. 7(A) through 7(J) are sectional views showing principal portions of an EPROM and are useful for explaining the production steps; and FIGS. 8(A) through 8(C) are sectional views taken along line VIII A—VIII A of FIG. 7(B), line VIII B—VIII B of FIG. 7(C) and line VIII C—VIII C of FIG. 7(J), respectively. FIGS. 9(A) through 9(J) are sectional views of principal portions of peripheral circuitry of an EPROM and are useful for explaining the production method of Embodiment 1 of the invention. In the drawings, an insulated gate field effect transistor (hereinafter called "MISFET") forming peripheral circuitry is shown so as to correspond to each production step of the memory cell of the EPROM.

Figure 9A:
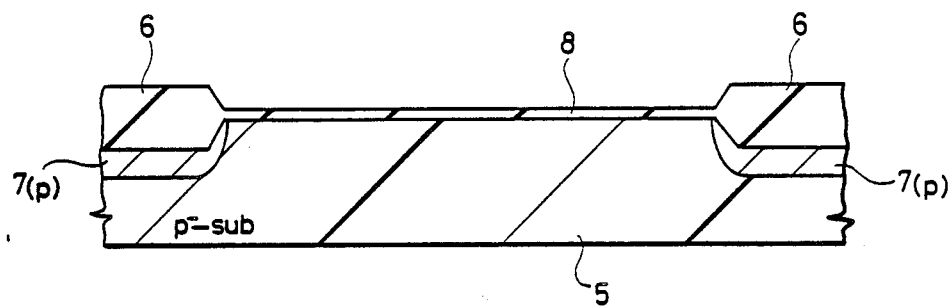
FIGS. 9(A) through 9(J) are sectional views showing principal portions of a peripheral circuit of an EPROM during production steps thereof, and is useful for explaining a production method of Embodiment I of the present invention.

First of all, a p⁻-type semiconductor substrate 5 consisting of silicon single crystal is prepared. A field insulating layer 6 is then formed on the main surface of the semiconductor substrate 5 at the portion between the regions where the semiconductor devices are to be formed. A p-type channel stopper region 7 is formed on the main surface of the semiconductor substrate 5 below the field insulating layer. The field insulating layer 6 is formed by selective thermal oxidation of the semiconductor substrate 5. The channel stopper region 7 is formed by introducing a p-type impurity by ion implantation, and then subjecting the impurity to drive-in diffusion by thermal oxidation. The techniques for forming the channel stopper region, and for forming the field insulating region, are conventional. As shown in FIGS. 7(A) and 9(A), an insulating layer 8 is formed on the main surface of the semiconductor substrate 5 in the region where the semiconductor device is to be formed. It is formed by thermal oxidation of the semiconductor substrate 5, for example, and its film thickness is, e.g., about 500 (Å), so that a gate insulating layer can be provided.

After the step shown in FIG. 7(A) and FIG. 9(A), the floating gate of the memory cell of the EPROM and the gate of the MISFET of the peripheral circuit are formed. For this purpose, a first conductive layer of the production process, e.g., a polycrystalline silicon layer about 3,500Å thick, is formed on the field insulating layer 6 and on the insulating layer 8, and P in a high concentration is introduced into the polycrystalline silicon layer by thermal diffusion or ion implantation primarily so as to reduce the resistance. This polycrystalline silicon layer is then patterned in a predetermined pattern, thereby forming a polycrystalline silicon layer 9B to constitute the floating gate in the region in which the memory cell of the EPROM is to be formed, and forming also a polycrystalline silicon layer 9B to constitute the gate electrode 9C of the MISFET in the region in which a MISFET of the peripheral circuit is to be formed.

Figure 9B:
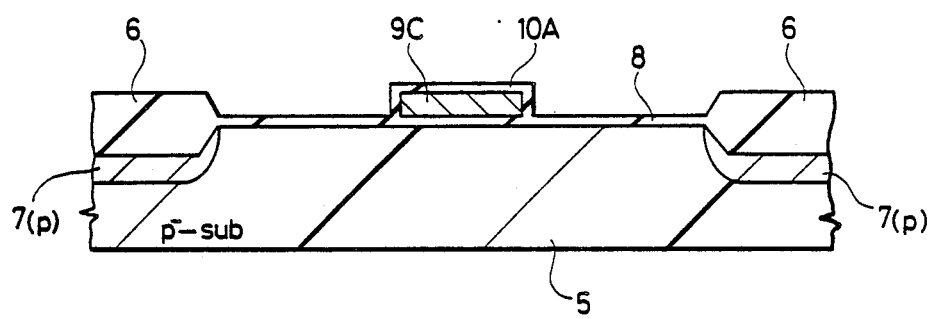

Then, an insulating layer 10A is formed in such a manner as to cover the polycrystalline silicon layer 9B and the gate electrode 9C, as illustrated in FIGS. 7(B), 8(A) and 9(B). This layer can be formed, for example, by thermally oxidizing the polycrystalline silicon layer 9B in a film thickness of, e.g., about 500 (Å).

Figure 9C:
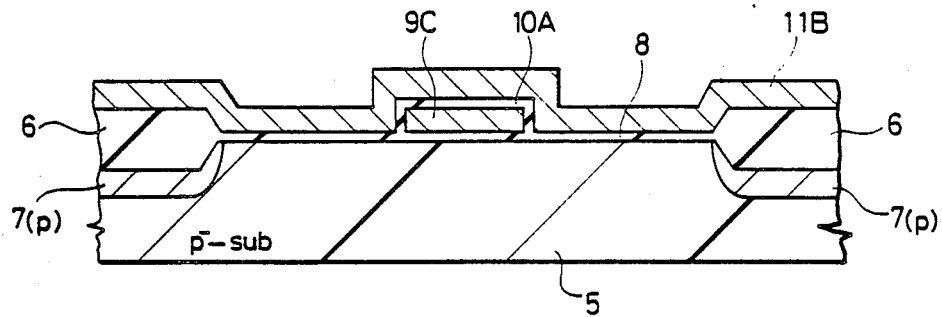

After the step shown in FIGS. 7(B), 8(A) and 9(B), the control gate of the memory cell of the EPROM and word lines (WL) are formed as shown in FIGS. 7(C), 8(B) and 9(C). For this purpose, a second conductive layer of the production process, e.g., a polycrystalline silicon layer 11B which has a film thickness of, e.g., about 3,500 (Å) and into which P is doped in a high concentration, to lower the resistance of this polycrystalline silicon layer, is formed on the insulating layer 10A and on the field insulating layer 6.

Figure 9D:
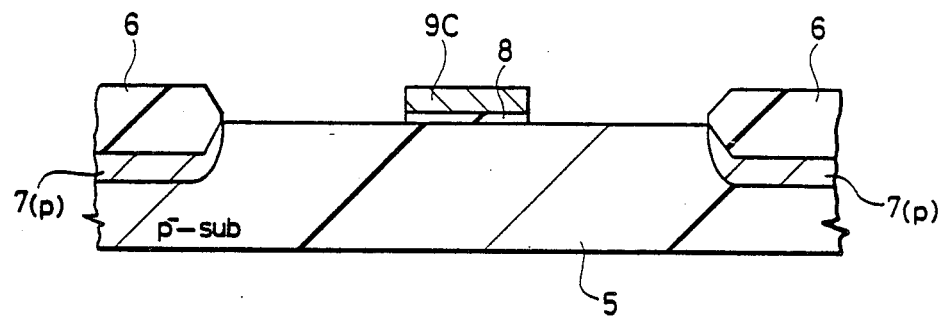

After the step shown in FIGS. 7(C), 8(B) and 9(C), the polycrystalline silicon layer 11B, the insulating layer 10A and the polycrystalline silicon layer 9B are patterned in the region where the memory cell of the EPROM is to be formed, thereby forming the conductive layer 11 serving as the control gate (CG) and the word lines (WL), the conductive layer 9 serving as the floating gate and the insulating layer 10 interposed between these conductive layers. As shown in FIGS. 7(D) and 9(D), the insulating layer 8 at the portions other than the portion below the conductive layer 9, the insulating layer 8 at the portions other than the portion below the gate electrode 9C, and the insulating layer 10A formed so as to cover the gate electrode 9C, are selectively removed, exposing the upper surface portion of the conductive layer 11, the upper surface portion of the gate electrode 9C and the predetermined upper surface portion of the semiconductor substrate 5.

Figure 9E:
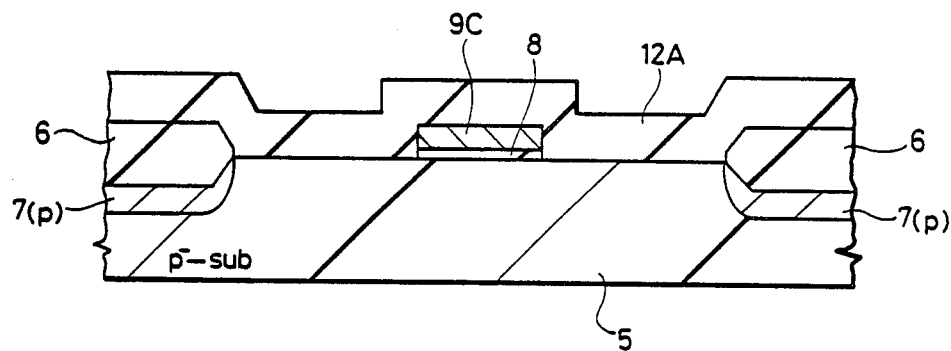

After the step shown in FIGS. 7(D) and 9(D), an insulating layer 12A is formed over the entire surface as shown in FIGS. 7(E) and 9(E). The insulating layer 12A consists, for example, of a silicon oxide (e.g., silicon dioxide) layer formed, e.g., by CVD, and its film thickness may range, for example, from about 5,000 to about 10,000 Å.

Figure 9F:
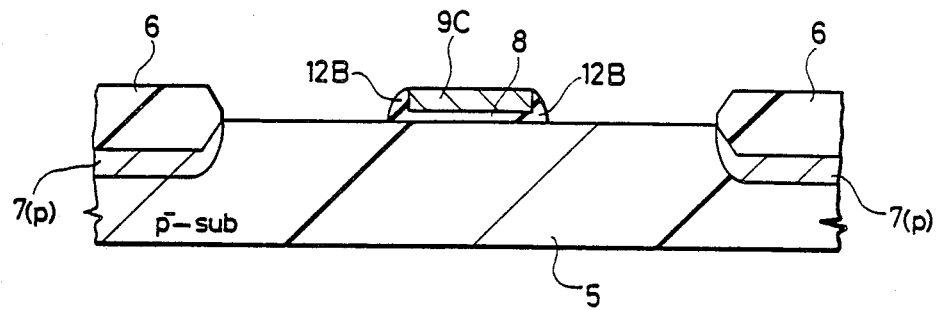

After the step shown in FIGS. 7(E) and 9(E), the insulating layer 12A is etched anisotropically by reactive ion etching or the like, as known in the art, in a depth corresponding to its film thickness. Thus, for formation of an oxide sidewall, see, for example, the article by Tsang, et al., "Fabrication of High-Performance LDDFET's with Oxide Sidewall-Spacker Technology", in *IEEE Transactions on Electron Devices*, Vol. ED-29, No. 4 (April 1982), pp. 590–6, the contents of which are incorporated herein by reference. As shown in FIGS. 7(F) and 9(F), an insulating layer 12B is formed on the sides of the conductive layers 9 and 11 so as to cover the sides of insulating layers 8 and 10 and to reach the upper surface of the conductive layer 11, and an insulating layer 12B reaching the upper surface portion of the gate electrode 9C is formed on the side of the gate electrode 9C. The film thickness of the insulating layer 12B is equal to, or greater than, the smaller of the thicknesses of the insulating layers 8 and 10.

Figure 9G:
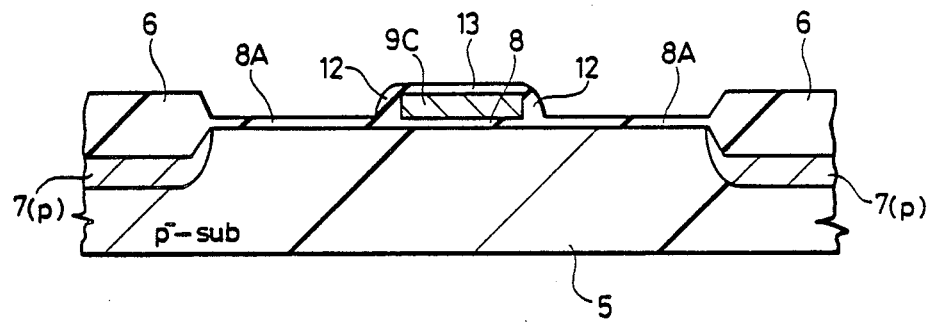

After the step shown in FIGS. 7(F) and 9(F), heat-treatment is conducted to bake, so as to densify the insulating film 12B as shown in FIGS. 7(G) and 9(G), providing a compact (dense) insulating layer 12. At the same time, an insulating layer 8A is formed on the upper surface portion of the semiconductor substrate 5 in which the semiconductor regions to be used as the source or drain region is to be formed, and an insulating layer 13 is formed on the conductive layer 11 and on the gate electrode 9C. The insulating layer 13 is disposed as a mask for introduction of an impurity for forming the semiconductor region, and to prevent the contamination by an unnecessary impurity that would affect adversely the electric characteristics of the EPROM. Oxidation in wet $O_2$ or dry $O_2$ at about 800° to about 1000° C. for 10–30 min may be used for the heat-treatment. As a result of the heat-treatment, approximately a 500Å- thick insulating layer 13, for example, is formed on the conductive layer 11 and on the gate electrode 9C. After the step shown in FIGS. 7(D) and 9(D), a thin insulating layer (for example, of a thickness of up to about 300Å) can be formed by thermal oxidation so as to cover the conductive layers 9, 11 and the gate electrode 9C. Then, the insulating layer 12 is formed. Such thin insulating layer can act to improve the adhesion of the conductive layers 9 and 11, and the gate electrode 9C, with the insulating layer 12.

Incidentally, this embodiment is advantageous from the aspect of the production process because the insulating layers 8A and 13 can be formed simultaneously with the insulating layer 12.

Figure 9H:
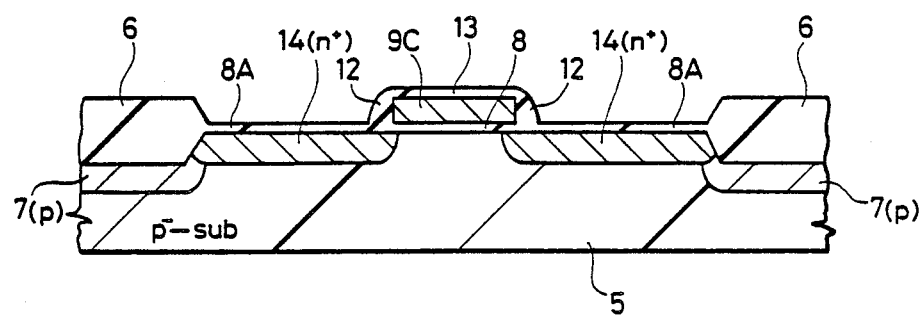

After the step shown in FIGS. 7(G) and 9(G), an $n^+$-type semiconductor region 14 to serve as the source or drain region is formed in the main surface portion of the semiconductor substrate 5 at both sides of the conductive layers 9, 11 and the gate electrode 9C in the regions where the semiconductor devices are to be formed, through the insulating layer 8A, mainly using the insulating layer 12, conductive layers 9, 11, gate electrode 9C and the field insulating layer 6 as masks for implanting the impurity, as shown in FIGS. 7(H) and 9(H). This region 14 can be formed, for example, by ion implantation of As ion impurity in a dose of $1 \times 10^{16}$ (atoms/cm2), for example, at an energy of, e.g., about 70 to about 90 (KeV). The insulating layer 12 reduces the diffusion quantity into the regions where the memory cell of the EPROM and the channel of a MISFET of the peripheral circuit are to be formed. The mirror capacity formed by the conductive layer 9 and the semiconductor region 14 and by the gate electrode 9C and the semiconductor region 14 can be reduced.

Accordingly, the operating speed of the EPROM and its peripheral circuit can be improved. The semiconductor region 14 is formed after the formation of the insulating layer 12, and since no heat-treatment step for an extended period is thereafter performed in the production process, excessive drive-in diffusion is not effected. For this reason, a sufficient effective channel length can be obtained and the short channel effect can be prevented.

Figure 9I:
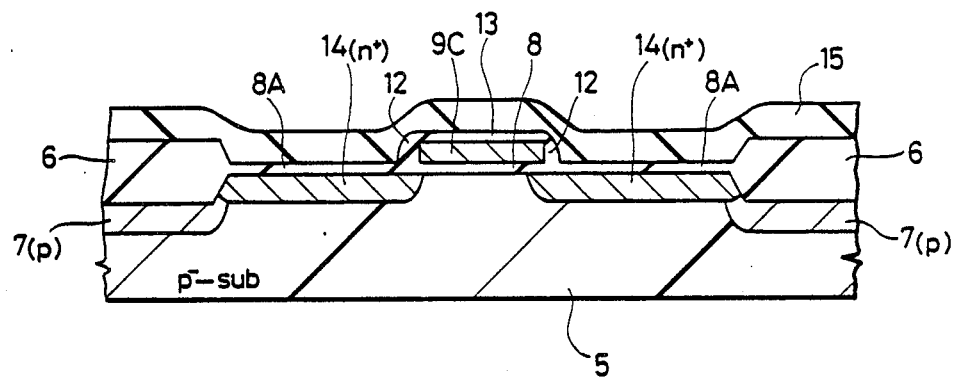

After the step shown in FIGS. 7(H) and 9(H), an insulating layer 15 is formed over the entire surface as shown in FIGS. 7(I) and 9(I). The layer 15 can be formed, for example, of a phosphosilicate glass (PSG) layer whose upper surface portion can be made flat and smooth by glass flow. The acute step shape defined by the conductive layers 9, 11 and the gate electrode 9C is mitigated by the insulating layer 12 so that the upper surface portion of the insulating layer 15 is made flatter and smoother.

Figure 9J:
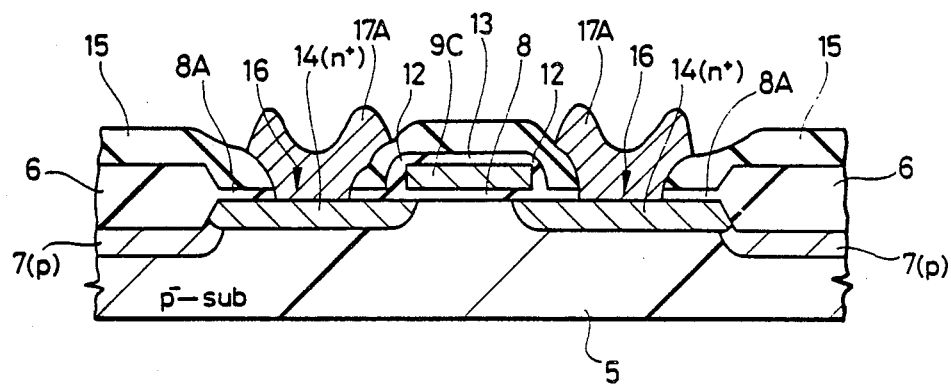

After the step shown in FIGS. 7(I) and 9(I), the insulating layers 8A and 15 on the predetermined semiconductor region 14 are selectively removed to define a contact hole 16. As shown in FIGS. 7(J), 8(C) and 9(J), third conductive layers 17, 17A of the production process are then formed on the insulating layer 15 so that they can be electrically connected with the predetermined semiconductor region 14 via the contact hole 16. The third conductive layers can be provided by use of an aluminum layer prepared by sputter deposition, for example. Though the aluminum layer has a relatively low resistance value, its depositability is low at the acute step portion. However, since the upper surface portion of the insulating layer 15 has been made relatively flat and smooth as described above, depositability of the aluminum layer is high so that the reliability in multi-layered wiring technique can be improved.

The EPROM of this embodiment can be completed after the series of production steps described above. Thereafter, post-treatment such as deposition of a protective film may be carried out.

Figure 7K:
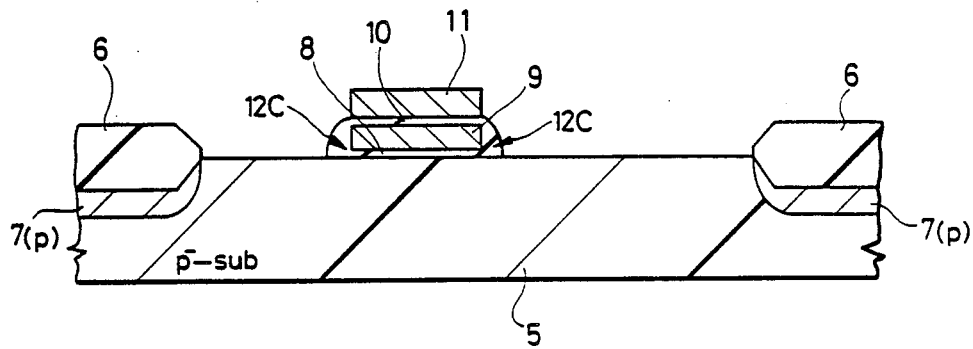

Incidentally, the insulating layer 12B formed in FIG. 7(F) may be formed in such a manner as shown in FIG. 7(K).

FIG. 7(K) is a sectional view of the principal portions of an EPROM in the production steps, and is useful for explaining the production method of another embodiment of the present invention.

After the step shown in FIG. 7(E), the anisotropic etching of the insulating layer 12A is controlled so that the insulating layer 12C covering the insulating layers 8 and 10 may be formed as shown in FIG. 7(K).

In the description given above, the insulating layer 12 is formed using a silicon oxide layer prepared by CVD, but the insulating layer 12 may be formed using a silicon oxide layer prepared by sputtering or plasma CVD, or such insulating layer 12 can be a densified layer prepared by baking and densifying a phosphosilicate glass layer having a low concentration (less than 4 mol %) of phosphorus that does not generate glass flow at temperatures used during processing after depositing the phosphilicate glass.

In the description given above, the gate electrode 9C constituting a part of the MISFET of the peripheral circuit of an EPROM is composed of the first conductive layer of the production process, but it may be composed of the second conductive layer of the production process.

Embodiment II

Next, another production method different from that of Embodiment I will be described.

FIGS. 10(A) through 10(D) are sectional views showing principal portions of an EPROM and are useful for explaining the production steps of Embodiment II.

Figure 10A:
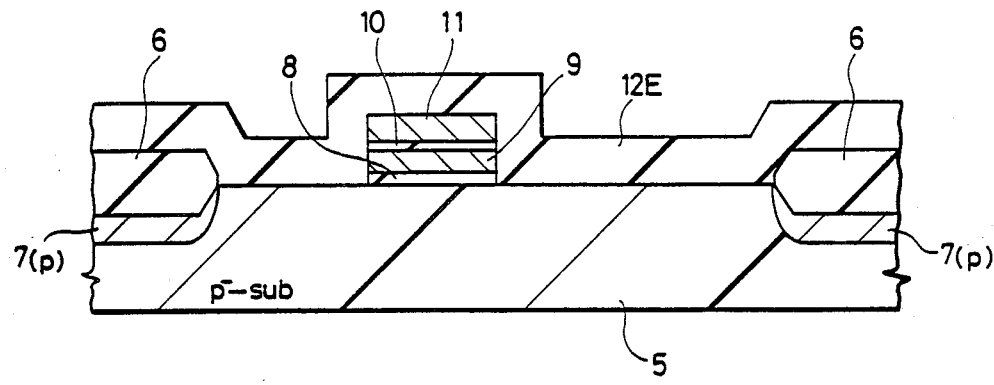
FIGS. 10(A) through 10(D) are sectional views showing principal portions of an EPROM in a production process thereof, and is useful for explaining a production method in Embodiment II of the present invention.

After the step shown in FIG. 7(E) of Embodiment I (that is, formation of silicon oxide layer 12A), heat-treatment is carried out so that an insulating layer 12E is formed by densifying the insulating layer 12A as shown in FIG. 10(A). Since the semiconductor region to serve as the source or drain region is not yet formed, the insulating layer 12E can be formed by steam or dry-$O_2$ oxidation at a relatively high temperature of from 800° to 1,000° C., for example.

Figure 10B:
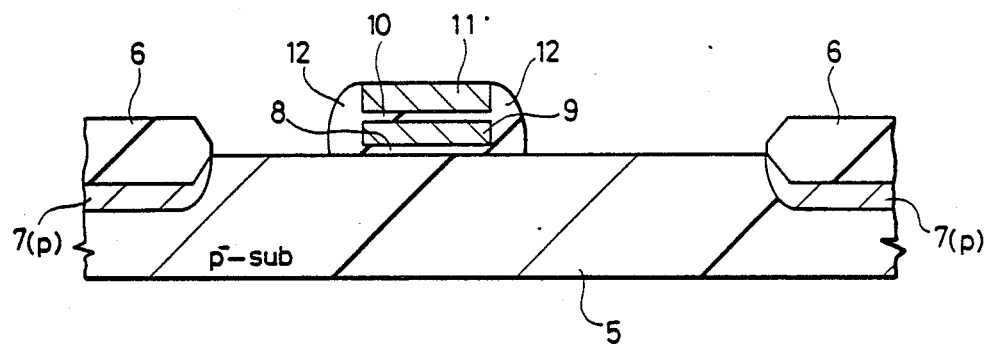

After the step shown in FIG. 10(A), anisotropic etching is conducted in the same way as in Embodiment I, thereby forming the insulating layer 12 as shown in FIG. 10(B).

Figure 10C:
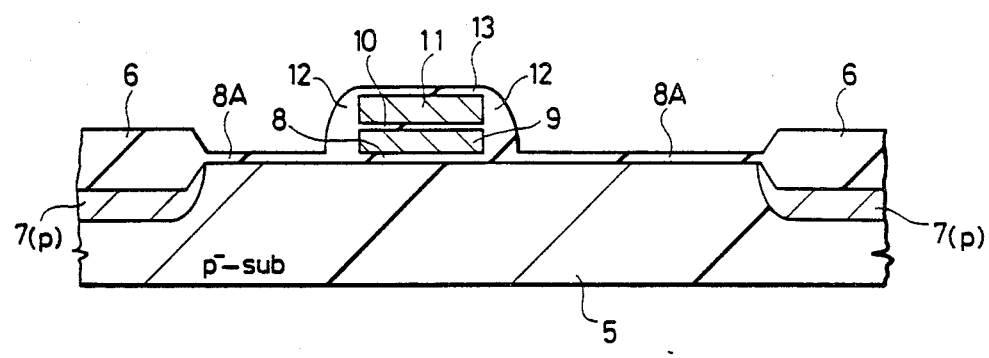

After the step shown in FIG. 10(B), heat-treatment is carried out to form the insulating layers 8A and 13 as shown in FIG. 10(C).

Figure 10D:
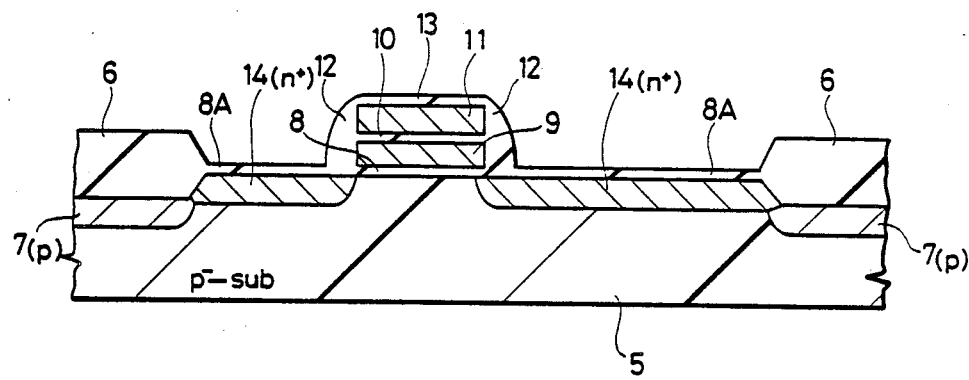

After the step shown in FIG. 10(C), the n+-type semiconductor regions 14, to serve as the source or drain region, are formed in the main surface portion of the semiconductor substrate 5 through the insulating layer 8A, as shown in FIG. 10(D).

After the step shown in FIG. 10(D), the steps shown in FIG. 7(I) and so forth of Embodiment I are conducted in the same way.

After the series of the production steps described above are carried out, an EPROM of this embodiment can be completed.

Embodiment III

First, the device of this embodiment will be described.

Figure 11:
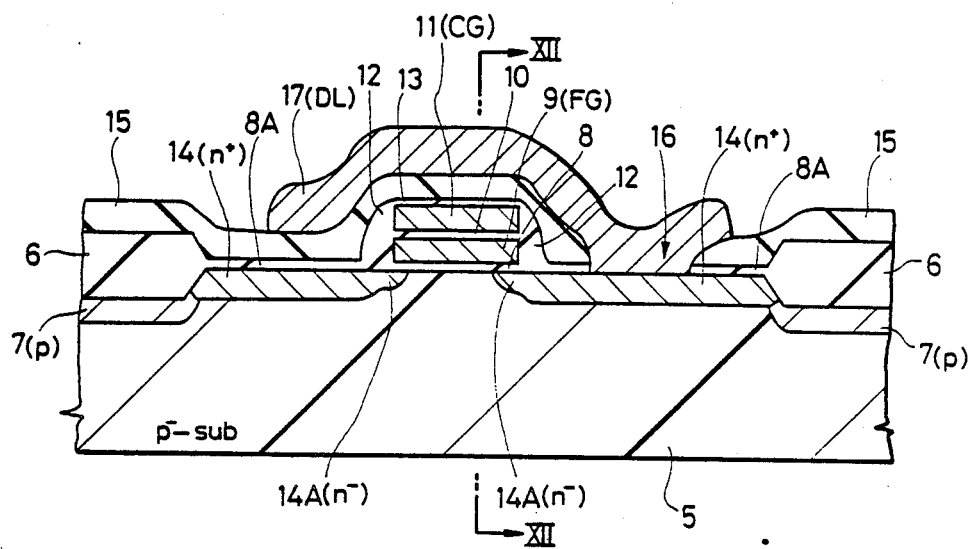
FIG. 11 is a sectional view showing principal portions of an EPROM, and is useful for explaining Embodiment III of the present invention.
Figure 12:
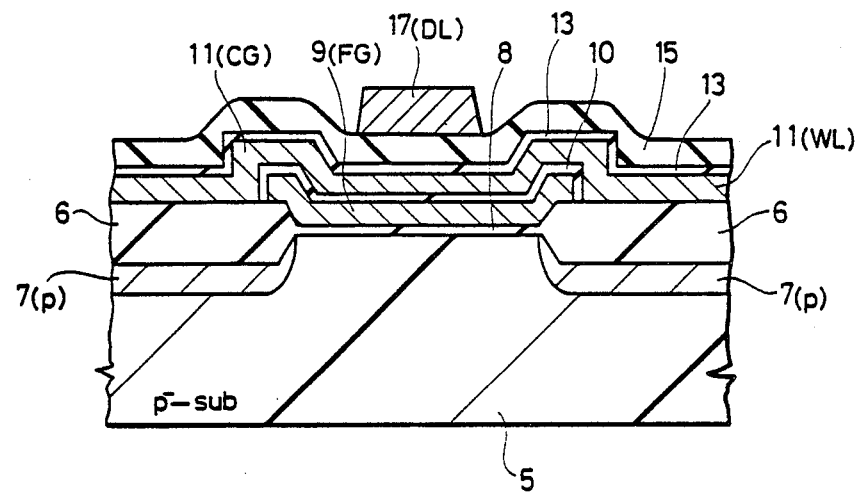
FIG. 12 is a sectional view taken along line XII—XII of FIG. 11.

FIG. 11 is a sectional view of principal portions of an EPROM and is useful for explaining the construction of Embodiment III of the present invention, and FIG. 12 is a sectional view taken along line XII—XII of FIG. 11.

In these drawings, reference numeral 14A represents an n⁻-type semiconductor region which is disposed in the main surface portion of the semiconductor substrate 5 at the portion between the region in which the channel of the field effect transistor as the memory cell of EPROM is to be formed and the semiconductor region 14, this n⁻-type semiconductor region being in electric contact with these regions. This n⁻-type semiconductor region is effective when the drive-in diffusion quantity to the region beneath the insulating layer 12 is not sufficient, or when the junction withstand voltage between the semiconductor region 14 serving as the drain region of the field effect transistor and the semiconductor substrate 5 is to be improved.

Next, the production method of this embodiment will be described.

Figure 13:
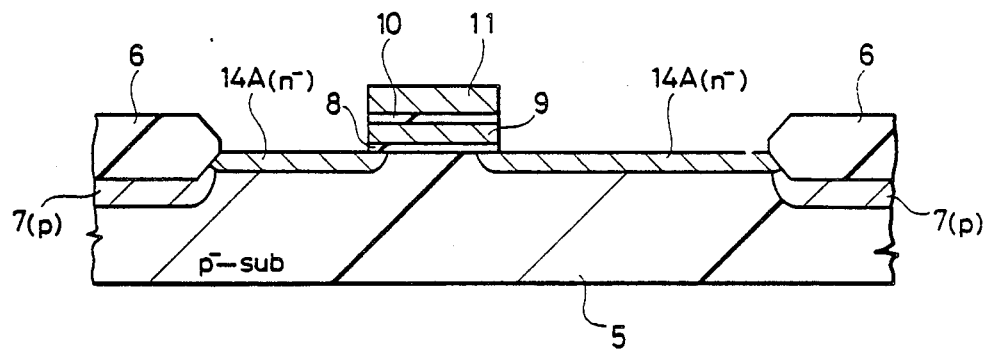
FIG. 13 is a sectional view showing principal portions of an EPROM during production steps thereof, and is useful for explaining a production method of Embodiment III of the present invention.

FIG. 13 is a sectional view of principal portions of an EPROM in the production process and is useful for explaining the production method of this Embodiment III.

After the step shown in FIG. 7(D) of Embodiment I, n⁻-type semiconductor regions 14A are formed on both sides of the conductive layers 9 and 11, using the conductive layer 11 and the field insulating layer 6 as masks for introducing an impurity, as shown in FIG. 13. The n⁻-type semiconductor regions 14A may be formed by implanting As ion impurity or P ion impurity of $1 \times 10^{14}$ to $1 \times 10^{15}$ (atoms/cm2) at 70 to 90 (KeV), for example. When implanting the impurity ion to form the semiconductor regions 14A, it is also possible to dispose an insulating layer which covers the upper surface portions of the conductive layers 9, 11 and semiconductor substrate 5 and functions as a mask for the ion implantation, and then to remove the insulating layer after the implantation of the impurity by thermal diffusion or the like.

After the step shown in FIG. 13, the steps shown in FIG. 7(E) of Embodiment I and so on may be carried out.

After the series of these production steps, an EPROM of this Embodiment can be completed.

Incidentally, this embodiment is not particularly limited to Embodiment I, and the production method of Embodiment II can also be applied.

In this embodiment, a MISFET of the peripheral circuit shown in FIGS. 9(A) through 9(J) of Embodiment I may also have the same structure (e.g., such n⁻-type semiconductor region). In other words, the n⁻-type semiconductor region is formed simultaneously with the step shown in FIG. 13 under the state shown in FIG. 9(D). Thereafter, the source and drain regions of MISFET of the peripheral circuit can be formed by the n+-type semiconductor region 14 and the n⁻-type semiconductor region 14A when the production steps shown in FIG. 9 are thereafter followed. This arrangement provides the effect that the breakdown voltage of the junction of the MISFET can be improved and the occurrence of hot carriers can be restricted.

Embodiment IV

First, the device of this embodiment will be described.

Figure 14:
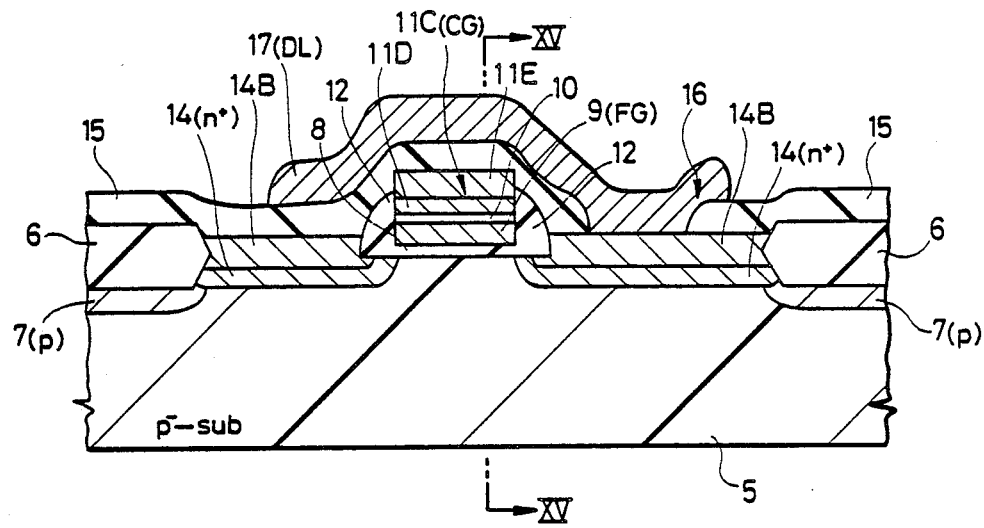
FIG. 14 is a sectional view showing principal portions of an EPROM and is useful for explaining Embodiment IV of the present invention.
Figure 15:
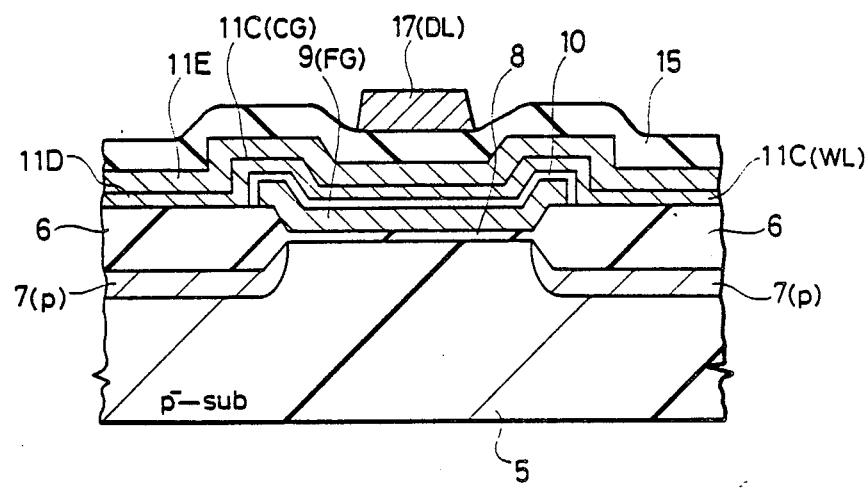
FIG. 15 is a sectional view taken along line XV—XV in FIG. 14.

FIG. 14 is a sectional view of principal portions of an EPROM and is useful for explaining the construction of Embodiment IV of this invention, and FIG. 15 is a sectional view taken along line XV—XV of FIG. 14.

Reference numeral 11C represents a conductive layer which is disposed on the conductive layer 9 via the insulating layer 10. It constitutes the control gate (CG) of the memory cell of an EPROM in the region in which the semiconductor device is to be formed, that is, on the conductive layer 9, and constitutes the word lines (WL) of the EPROM at other portions. The conductive layer 11C is formed by forming a layer 11E of a silicide of a metal having a high melting point and lower resistance value than that of a polycrystalline silicon layer 11D, such as Mo, W, Ta, Ti or the like, on the polycrystalline silicon layer 11D. This can improve the operating speed of the EPROM. Alternatively, the conductive layer 11C may be made of the silicide layer 11E alone, or may be made of a layer of the high melting metal. Reference numeral 14B represents a silicide layer disposed on the main surface portion of the semiconductor region 14 in order to reduce the resistance of the semiconductor region 14 and to improve the operating speed of the EPROM.

Next, a production method of this embodiment will be described.

Figure 16A:
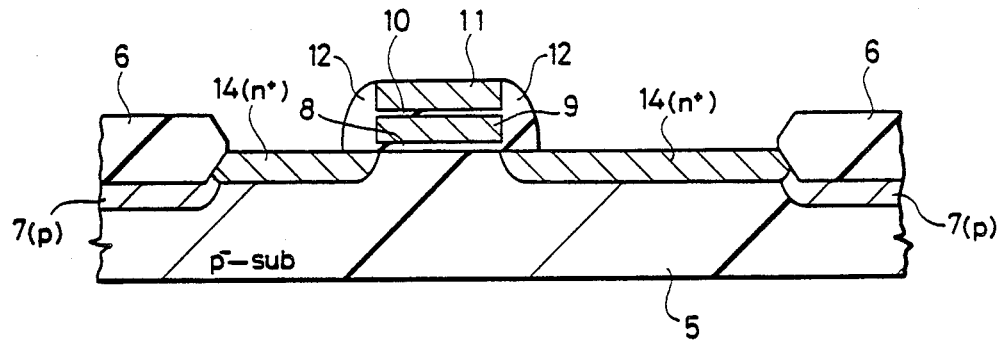
FIGS. 16(A) through 16(C) are sectional views showing principal portions of an EPROM during a production process thereof, and is useful for explaining a first production method of Embodiment IV of the present invention.
Figure 16B:
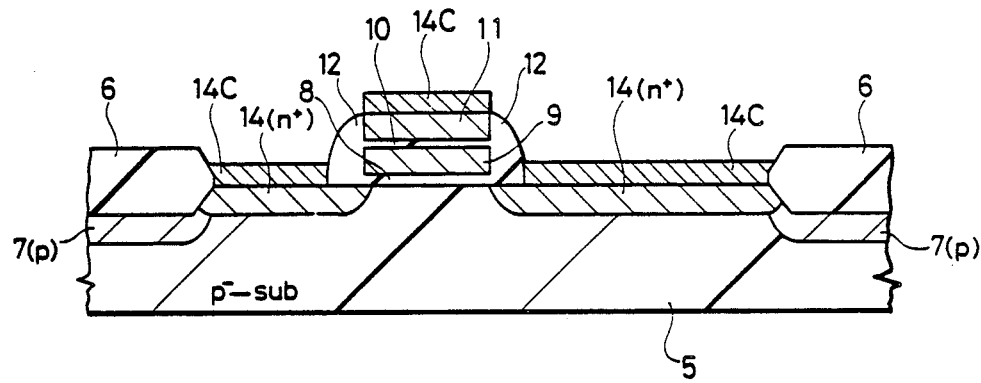
Figure 16C:
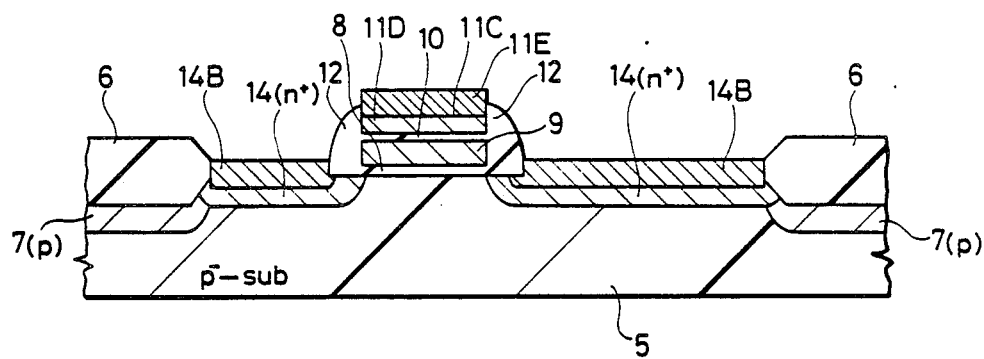

FIGS. 16(A) through 16(C) are sectional views of principal portions of an EPROM during the production process, and are useful for explaining the first production method of Embodiment IV of this invention.

After the step shown in FIG. 10(B) of Embodiment II, an n+-type semiconductor region 14 to be used as the source or drain region is formed on the main surface portion of the semiconductor substrate 5 as shown in FIG. 16(A).

After the step shown in FIG. 16(A), a layer 14C of a metal of a high melting point is selectively formed by selective CVD (or metal organic CVD) on the conductive layer 11 and on the semiconductor region 14 as shown in FIG. 16 (B). As the layer 14C of the metal of a high melting point, tungsten (W) can be used, for example.

After the step shown in FIG. 16(B), the metal layer 14C is heat-treated so as to leave the lower portion of conductive layer 11 as polycrystalline silicon layer 11D, to form a silicide layer 11E on the upper portion of the conductive layer 11 and to convert the main surface portion of the semiconductor region 14 to a silicide layer 14B, as shown in FIG. 16(C).

The steps shown in FIG. 7(I) of Embodiment I and so on are thereafter carried out after the step shown in FIG. 16(C).

After the series of these production steps, an EPROM of this embodiment can be completed.

Figure 17A:
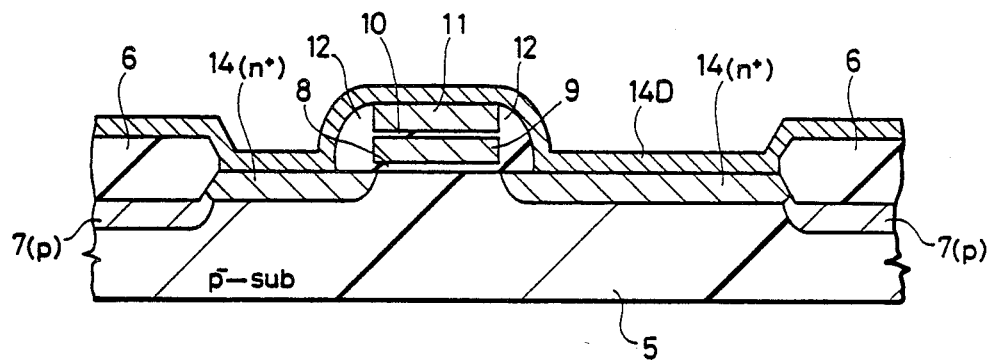
FIGS. 17(A) and 17(B) are sectional views showing principal portions of an EPROM during a production process thereof, and is useful for explaining a second production method of Embodiment IV of the present invention.
Figure 17B:
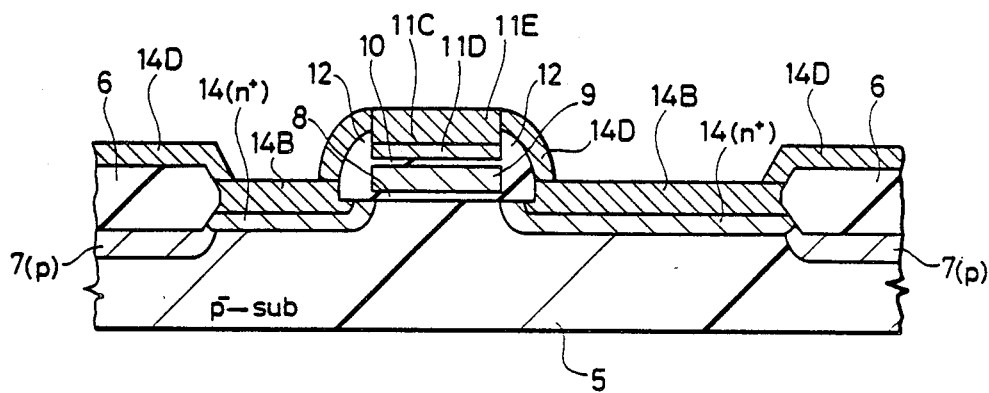

FIGS. 17(A) and 17(B) are sectional views of principal portions of an EPROM and are useful for explaining a second production method of Embodiment IV of the present invention.

After the step of the first production method shown in FIG. 16(A), a layer 14D of a metal having a high melting point (e.g. Ti, W, Ta or Mo) is deposited over the entire surface by sputtering, for example, as shown in FIG. 17(A). After the step shown in FIG. 17(A), the metal layer 14D having a high melting point and silicon in contact therewith are reacted by heat-treatment as shown in FIG. 17(B) so as to convert the upper portion of the conductive layer 11 to a silicide layer 11E while leaving its lower portion as a polycrystalline silicon layer 11D, as shown in FIG. 17(B). Furthermore, the main surface portion of the semiconductor region 14 is turned into a silicide layer 14B. Thereafter, the metal layer 14D of the metal having a high melting point that has not been turned into silicide is selectively removed.

Thereafter, the steps of Embodiment I shown in FIG. 7(I) and so on are carried out.

After the series of the production steps described above, an EPROM of this embodiment can be completed.

This embodiment may be applied to Embodiment III described earlier.

Embodiment V

Figure 18:
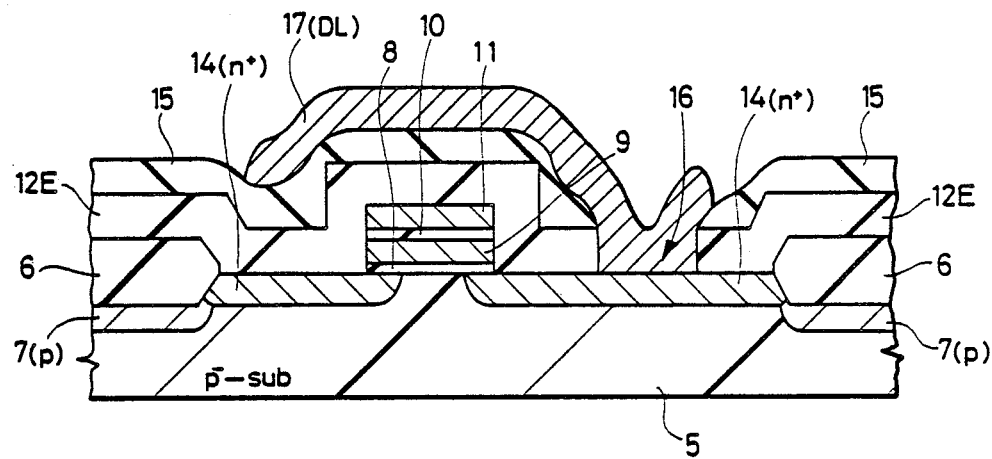
FIGS. 18 and 19 are sectional views showing principal portions of an EPROM and is useful for explaining the definite structure of Embodiment V of the present invention.
Figure 19:
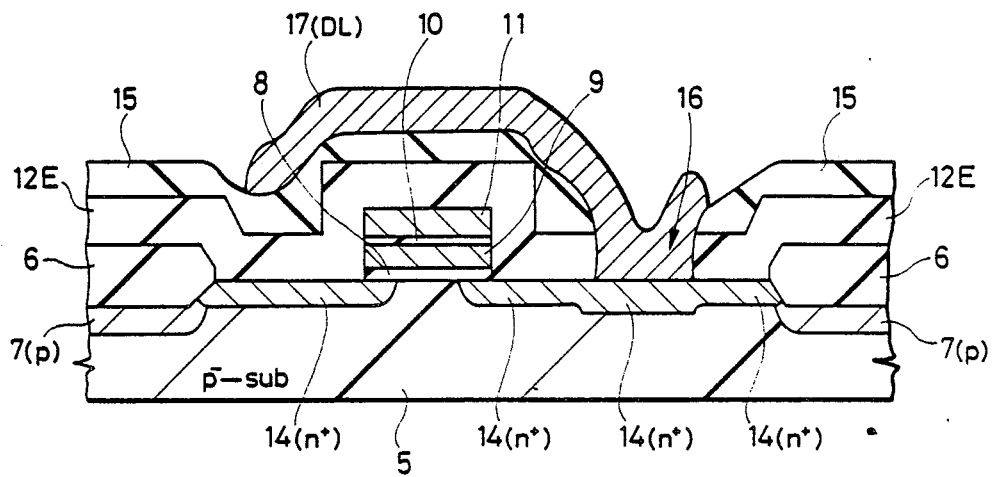

FIG. 18 and 19 are sectional views of principal portions of an EPROM and are useful for explaining the device of Embodiment V of this invention.

This embodiment uses the insulating layer 12E consisting of a baked and densified silicon oxide layer as such without partial removal thereof and forming the insulating layer 8A, for example, as in the foregoing embodiments.

In a semiconductor integrated circuit device equipped with a field effect transistor having a conductive layer to function as a gate, and, in particular, having a first conductive layer to serve as a floating gate, the present invention provides the following effects.

(1) A first insulating layer consisting, for example, of the baked and densified (compact) silicon oxide layer is disposed on the side of the first conductive layer so as to cover at least the gate insulating layer for the field effect transistor. This arrangement makes it possible to restrict the leakage of the charge, as the data, stored in the first conductive layer, to the semiconductor substrate, so that the charge retention characteristics of the field effect transistor can be improved.

(2) The first insulating layer having a film thickness greater than that of the gate insulating layer is disposed on the side of the first conductive layer so as to cover at least the gate insulating layer. This arrangement makes it possible to restrict the leakage of the charge, stored in the first conductive layer, to the semiconductor substrate, so that the charge retention characteristics of the field effect transistor can be improved.

(3) The present invention provides a field effect transistor including conductive layers, the conductive layers including a first conductive layer, and a second conductive layer to function as the control gate disposed on the first conductive layer via an inter-layer insulating layer. A first insulating layer is disposed on both sides of the conductive layers so as to cover at least the gate insulating layer and the inter-layer insulating layer. According to this arrangement, the leakage of the charge as the data stored in the first conductive layer to the semiconductor substrate and to the control gate can be restricted so that the retention characteristics of the charge, as the data, by the field effect transistor can be improved. Moreover, since lift-up particularly at the end portions of the second conductive layer can be prevented, the drop of the parasitic capacitance formed by the first and second conductive layers can be prevented.

(4) Since the drop of the parasitic capacitance can be restricted by the item (3) described above, the reliability and operating speed in the write and read modes of the data can be improved.

(5) The first insulating layer capable of mitigating the acute step shape is disposed on the sides of the conductive layers, so that the upper surface of the insulating layer disposed thereon can be made relatively flat and smooth, and depositability of further layers, including an upper conductive layer, can be improved.

(6) The first insulating layer capable of mitigating the acute step shape is disposed on the sides of the conductive layers of the field effect transistor and on the sides of other portions such as on the sides of the gate electrode of a MISFET, so that the upper surface portion of an insulating layer to be disposed thereon can be made relatively flat and smooth, and the depositability of further layers, including an upper conductive layer disposed on the upper surface portion of the insulating layer, can be improved.

(7) After the first insulating layer is formed on the sides of the conductive layer, a pair of semiconductor regions to be used as the source or drain region are formed. This arrangement eliminates the necessity of heat-treatment for an extended period which would otherwise generate unnecessary extension diffusion of the semiconductor region. Accordingly, semiconductor regions having a shallow junction depth can be provided.

(8) Due to the effect described in the item (7) described above and to the effect brought forth by the first insulating layer, unnecessary extension of the diffusion of the semiconductor region to the region where the channel of the field effect transistor is to be formed is restricted, and a sufficient effective channel length can be obtained. Therefore, the short channel effect can be prevented.

(9) Due to the effect described in the item (7) described above and to the effect brought forth by the first insulating layer, unnecessary drive-in diffusion of the semiconductor region to the region where the channel of the field effect transistor is to be formed is restricted, so that the mirror capacity formed by the first conductive layer and the semiconductor region can be reduced.

(10) Since the mirror capacity can be reduced as described in the item (9), the operating speed can be improved.

(11) Due to the effects described in the items (1) through (6) and (8), the retention characteristics of the charge, as the data, can be improved, the depositability of further layers, including an upper conductive layer, can be improved, and the short channel effect can be prevented. Thus, the reliability of the semiconductor integrated circuit device can be improved.

(12) The operating speed of the semiconductor integrated circuit device can be improved by the effects described in items (4), (7) and (9).

(13) The integration density of the semiconductor integrated circuit device can be further improved because its reliability can be improved by the effects described in the items (1) through (4), (7), (8) and (11).

Although the present invention has thus been described definitely with reference to some preferred embodiments thereof, the present invention is not particularly limited to them, but can be practiced in various modified manners without departing from the spirit and scope thereof.

For example, although the foregoing embodiments have been described with reference to the case in which the memory cell of an EPROM is provided in the semiconductor substrate per se, the memory cell of an EPROM may be disposed in a well region after forming such a well region in a semiconductor substrate. Thus, the present invention contemplates such well region as a "semiconductor substrate" for forming the memory cell.

Although the foregoing embodiments have been described with reference to the memory cell of an EPROM having a floating gate and a control gate, the memory cell is not limited thereto but may be one that has only, e.g., a floating gate.

Although the foregoing embodiments have been described with reference to the case in which a MISFET is used as the peripheral circuit of EPROM, it may be a complementary MISFET or a bipolar transistor.

While we have shown and described various embodiments in accordance with the present invention, it is understood that the same is not limited thereto, but is susceptible of numerous changes and modifications as known to those skilled in the art, and we, therefore, do not wish to be limited to the details shown and described herein, but intend to cover all such changes and modifications as are encompassed by the scope of the appended claims.

What is claimed is:

1. A semiconductor device comprising:
   a conductive layer disposed above a surface of a semiconductor substrate and isolated electrically from semiconductor regions formed in said semiconductor substrate by a first insulating layer disposed between said semiconductor substrate and said conductive layer;
   another conductive layer disposed on said conductive layer via a third insulating layer, each of said conductive layer and said another conductive layer having a top and a bottom, and sides extending between the top and the bottom;
   a second insulating layer disposed sideways of said conductive layer and another conductive layer and covering sides of said conductive layer and another conductive layer and said first insulating layer, said second insulating layer being formed by deposition and being a dense insulating layer sufficiently dense so as to prevent charge leakage from said conductive layer, wherein a portion of said second insulating layer which covers sides of said conductive layer has a film thickness, in a direction parallel to the surface of the semiconductor substrate, greater than the film thickness of another portion of said second insulating layer which covers sides of said another conductive layer;
   two semiconductor regions formed respectively in the semiconductor substrate at the sides of the conductive layer, said two semiconductor regions being of one conductivity type, and a portion of the semiconductor substrate beneath the conductive layer being of a conductivity type opposite that of said two semiconductor regions;
   said device constituting a field effect transistor, said portion of the semiconductor substrate beneath the conductive layer constituting a channel of said field effect transistor, with the conductive layer being a floating gate and said another conductive layer being a control gate of said field effect transistor, the first insulating layer being the gate oxide layer of the field effect transistor; and
   the device including further semiconductor regions having the same conductivity type as that of said two semiconductor regions but a lower impurity concentration than that of the two semiconductor regions, said further semiconductor regions being formed respectively between the region in which the channel of said field effect transistor is formed and said two semiconductor regions, wherein the two semiconductor regions are regions in self-alignment with the second insulating layer and the conductive and another conductive layers, and the further semiconductor regions are regions in self-alignment with the conductive and another conductive layers.

2. The semiconductor device as defined in claim 1, wherein said second insulating layer comprises a silicon oxide layer, formed by deposition and then baked for densification so as to prevent charge leakage from the conductive layers, the conductive layers not exhibiting lift-up from the substrate.

3. The semiconductor device as defined in claim 2, wherein the baking so as to densify the layer of deposited insulating material is a baking in an oxygen-containing atmosphere at a temperature of 800° to 1000° C.

4. The semiconductor device as defined in claim 1, wherein said second insulating layer comprises (1) a silicon oxide layer formed by chemical vapor deposition or (2) a low concentration phosphosilicate glass layer which is not subjected to glass flow.

5. The semiconductor device as defined in claim 1, wherein said second insulating layer is comprised of a silicon oxide layer formed by sputtering.

6. The semiconductor device as defined in claim 1, wherein said second insulating layer is comprised of a silicon oxide layer formed by plasma chemical vapor deposition.

7. The semiconductor device as defined in claim 1, wherein the second insulating layer is an $SiO_2$ layer.

8. The semiconductor device as defined in claim 1, wherein said second insulating layer covers sides of the third insulating layer.

9. The semiconductor device as defined in claim 8, wherein said second insulating layer also covers sides of the control gate.

10. The semiconductor device as defined in claim 9, further comprising another insulating layer formed on said another conductive layer so as to cover the another conductive layer.

11. The semiconductor device as defined in claim 1, wherein said second insulating layer is a layer formed by anisotropic reactive ion etching of a layer of insulating material formed over the another conductive layer and over the two semiconductor regions.

12. The semiconductor device as defined in claim 1, wherein said conductive layer is comprised of a polycrystalline silicon layer.

13. The semiconductor device as defined in claim 1, wherein said another conductive layer is comprised of a polycrystalline silicon layer.

14. The semiconductor device as defined in claim 1, wherein said another conductive layer includes a layer selected from the group consisting of (a) a layer of a metal having a high melting point and (2) a layer of a compound of said metal having a high melting point and silicon.

15. The semiconductor device as defined in claim 1, wherein said another conductive layer is a layer formed by depositing a layer of a metal having a high melting point, or a layer of a compound of said metal having a high melting point and silicon, directly onto a layer of polycrystalline silicon.

16. The semiconductor device as defined in claim 1, wherein said second insulating layer extends on the semiconductor substrate over the further semiconductor regions.

17. A semiconductor integrated circuit device comprising a memory cell and a peripheral circuit, with said memory cell including a field effect transistor and the peripheral circuit including a field effect transistor, wherein the field effect transistor of the memory cell includes a floating gate and a control gate being disposed on a semiconductor substrate, with first and third insulating layers being disposed between the substrate and floating gate, and between the floating gate and control gate, respectively, the field effect transistor of the memory cell also including source and drain regions formed in the substrate at the sides of the floating gate; wherein the field effect transistor of the peripheral circuit includes a gate disposed on said semiconductor substrate, with a gate insulating layer disposed between said substrate and said gate, and with source and drain regions formed in the substrate at the sides of the gate; and wherein the field effect transistor of the memory cell and the field effect transistor of the peripheral circuit have formed at the sides of the floating and control gates, and at the sides of the gate, respectively, a second insulating layer, said second insulating layer being formed so as to cover the sides of the first and third insulating layers and the sides of the floating and control gates, a portion of said second insulating layer, which covers sides of said floating gate, has a film thickness, in a direction parallel to the surface of the semiconductor substrate, greater than the film thickness of the portion of said second insulating layer which covers the sides of said control gate, said second insulating layer being formed by deposition and being a dense insulating layer that is sufficiently dense so as to prevent charge leakage from the gates to the semiconductor substrate, the gates not exhibiting lift-up from the substrate.

18. The semiconductor integrated circuit device as defined in claim 17, wherein said memory cell is a memory cell of an EPROM.

19. A semiconductor device, produced by a method comprising the steps of:
 (a) forming conductive layers on a semiconductor substrate of one conductivity type, said conductive layers including a first conductive layer disposed on said semiconductor substrate and isolated electrically therefrom by a first insulating layer, and a second conductive layer disposed on said first conductive layer via a third insulating layer, said conductive layers each having top and bottom surfaces and sides extending therebetween;
 (b) forming a second insulating layer at both sides of said conductive layers so as to cover sides of said first and third insulating layers and sides of said first and second conductive layers, the step of forming the second insulating layers including deposition of material for forming the second insulating layer, patterning by anisotropic reactive ion etching and baking for densification thereof, said second insulating layer being sufficiently dense so as to prevent charge leakage from the conductive layers to the semiconductor substrate, a portion of said second insulating layer covering sides of said first conductive layer having a thickness, in a direction parallel to the surface of the semiconductor substrate, greater than the thickness, in said direction, of the second insulating layer covering sides of the second conductive layer, the conductive layers not exhibiting lift-up after said forming said second insulating layer; and
 (c) forming a pair of semiconductor regions, of a conductivity type opposite to that of said one conductivity type, in the main surface portion of said semiconductor substrate on both sides of said conductive layer, the forming of the pair of semiconductor regions including introduction of impurity ions into the semiconductor substrate, wherein the semiconductor regions are regions formed after forming the second insulating layer, whereby extension diffusion of the impurity ions to a region of the semiconductor substrate beneath the conductive layers is limited.

20. A semiconductor integrated circuit device comprising a memory cell and a peripheral circuit, with said memory cell including a field effect transistor and the peripheral circuit including a field effect transistor, wherein the field effect transistor of the memory cell includes a floating gate and a control gate, being disposed on a semiconductor substrate, with first and third insulating layers being disposed between the substrate and floating gate, and between the floating gate and control gate, respectively, the field effect transistor of the memory cell also including source and drain regions formed in the substrate at the sides of the floating gate; wherein the field effect transistor of the peripheral circuit includes a gate disposed on said semiconductor substrate, with a gate insulating layer disposed between said substrate and said gate, and with source and drain regions formed in the substrate at the sides of the gate; and wherein the field effect transistor of the memory cell and the field effect transistor of the peripheral circuit have a second insulating layer formed at the sides of the floating and control gates, and at the sides of the gate, respectively, said second insulating layer being formed so as to cover the sides of the first and third insulating layers and the sides of the floating and control gates, a portion of said second insulating layer, which covers sides of said floating gate, has a film thickness, in a direction parallel to the surface of the semiconductor substrate, greater than the film thickness of the portion of said second insulating layer which covers the sides of said control gate, said second insulating layer being formed by deposition and being a dense insulating layer that is sufficiently dense so as to prevent charge leakage from the gates to the semiconductor substrate, said source and drain regions of the field effect transistor of the memory cell comprising first semiconductor regions and second semiconductor regions, said second semiconductor regions having the same conductivity type as that of said first semiconductor regions but having a lower impurity concentration than that of said first semiconductor regions, said second semiconductor regions being formed respectively between a channel of said field effect transistor of said memory cell and said first semiconductor regions, wherein said first semiconductor regions are regions in self-alignment with the second insulating layer and the floating gate and the control gate, and said second semiconductor regions are regions in self-alignment with the floating and control gates.

21. The semiconductor device as defined in claim 20, wherein said source and drain regions of the field effect transistor of the peripheral circuit comprise third semiconductor regions and fourth semiconductor regions, said fourth semiconductor regions having the same conductivity type as that of said third semiconductor regions but having a lower impurity concentration than that of said third semiconductor regions, and said fourth semiconductor regions being formed respectively between a channel of said field effect transistor of the peripheral circuit and said third semiconductor regions.

22. The semiconductor device as defined in claim 21, wherein said third semiconductor regions are regions in self-alignment with the second insulating layer and the gate of the field effect transistor of the peripheral circuit, and said fourth semiconductor regions are regions in self-alignment with the gate.

* * * * *